United States Patent
Kim et al.

(10) Patent No.: US 10,847,759 B2
(45) Date of Patent: Nov. 24, 2020

(54) METHOD OF MANUFACTURING DISPLAY APPARATUS

(71) Applicant: Samsung Display Co., Ltd., Yongin-si, Gyeonggi-do (KR)

(72) Inventors: Hyojin Kim, Suwon-si (KR); Sokwon Noh, Suwon-si (KR); Changhan Lee, Cheonan-si (KR); Myunghwan Kim, Yongin-si (KR); Sangyeol Kim, Hwaseong-si (KR); Woohyun Kim, Hwaseong-si (KR); Taehyun Sung, Seoul (KR); Sejoong Shin, Cheonan-si (KR); Horyun Chung, Suwon-si (KR)

(73) Assignee: Samsung Display Co., Ltd., Yongin-si (KR)

( * ) Notice: Subject to any disclaimer, the term of this patent is extended or adjusted under 35 U.S.C. 154(b) by 0 days.

(21) Appl. No.: 16/659,422

(22) Filed: Oct. 21, 2019

(65) Prior Publication Data

US 2020/0185660 A1 Jun. 11, 2020

(30) Foreign Application Priority Data

Dec. 10, 2018 (KR) .......................... 10-2018-0158366

(51) Int. Cl.
*H01L 51/56* (2006.01)
*H01L 51/00* (2006.01)
(Continued)

(52) U.S. Cl.
CPC .......... *H01L 51/56* (2013.01); *H01L 27/3225* (2013.01); *H01L 27/3244* (2013.01);
(Continued)

(58) Field of Classification Search
CPC .. H01L 51/56; H01L 51/0018; H01L 51/5246
See application file for complete search history.

(56) References Cited

U.S. PATENT DOCUMENTS

| 8,759,197 B2 | 6/2014 | Holden |
| 8,809,732 B2 | 8/2014 | Sykes et al. |

(Continued)

FOREIGN PATENT DOCUMENTS

| JP | 2008-501531 A | 1/2008 |
| KR | 10-0581960 B1 | 5/2006 |

(Continued)

OTHER PUBLICATIONS

EPO Extended Search Report dated Apr. 14, 2020, for corresponding European Patent Application No. 19214995.3 (7 pages).

*Primary Examiner* — Ahmed N Sefer
(74) *Attorney, Agent, or Firm* — Lewis Roca Rothgerber Christie LLP

(57) ABSTRACT

A method of manufacturing a display apparatus according to some embodiments of the present disclosure includes preparing a display substrate in which at least one hole region is defined when viewed in a planar view, disposing a first adhesive film on the display substrate, etching the hole region of the display substrate by irradiating first light in the form of laser light, and peeling off the first adhesive film, wherein the first adhesive film transmits at least a portion of the first light.

20 Claims, 19 Drawing Sheets

(51) Int. Cl.
*H01L 51/52* (2006.01)
*H01L 27/32* (2006.01)

(52) U.S. Cl.
CPC ........ *H01L 51/003* (2013.01); *H01L 51/0018* (2013.01); *H01L 51/5246* (2013.01)

(56) References Cited

U.S. PATENT DOCUMENTS

| | | | |
|---|---|---|---|
| 2004/0038439 A1* | 2/2004 | Sakamoto | H01L 27/3281 438/46 |
| 2008/0287028 A1 | 11/2008 | Ozawa | |
| 2011/0194063 A1* | 8/2011 | Lee | G02F 1/1333 349/153 |
| 2013/0168661 A1* | 7/2013 | Min | H01L 51/5212 257/40 |
| 2016/0190453 A1 | 6/2016 | Nirengi et al. | |
| 2017/0263887 A1* | 9/2017 | Han | H01L 27/3276 |
| 2017/0304951 A1 | 10/2017 | Lee | |
| 2017/0323779 A1* | 11/2017 | Um | G02F 1/133711 |
| 2018/0337334 A1* | 11/2018 | Kim | H01L 51/0011 |
| 2019/0363266 A1 | 11/2019 | Tanaka | |

FOREIGN PATENT DOCUMENTS

| | | |
|---|---|---|
| KR | 10-1712483 B1 | 3/2017 |
| KR | 10-2017-0120225 A | 10/2017 |
| KR | 10-2018-0056154 A | 3/2019 |
| KR | 10-1955002 B1 | 3/2019 |
| WO | WO 2018/138779 A1 | 8/2018 |

\* cited by examiner

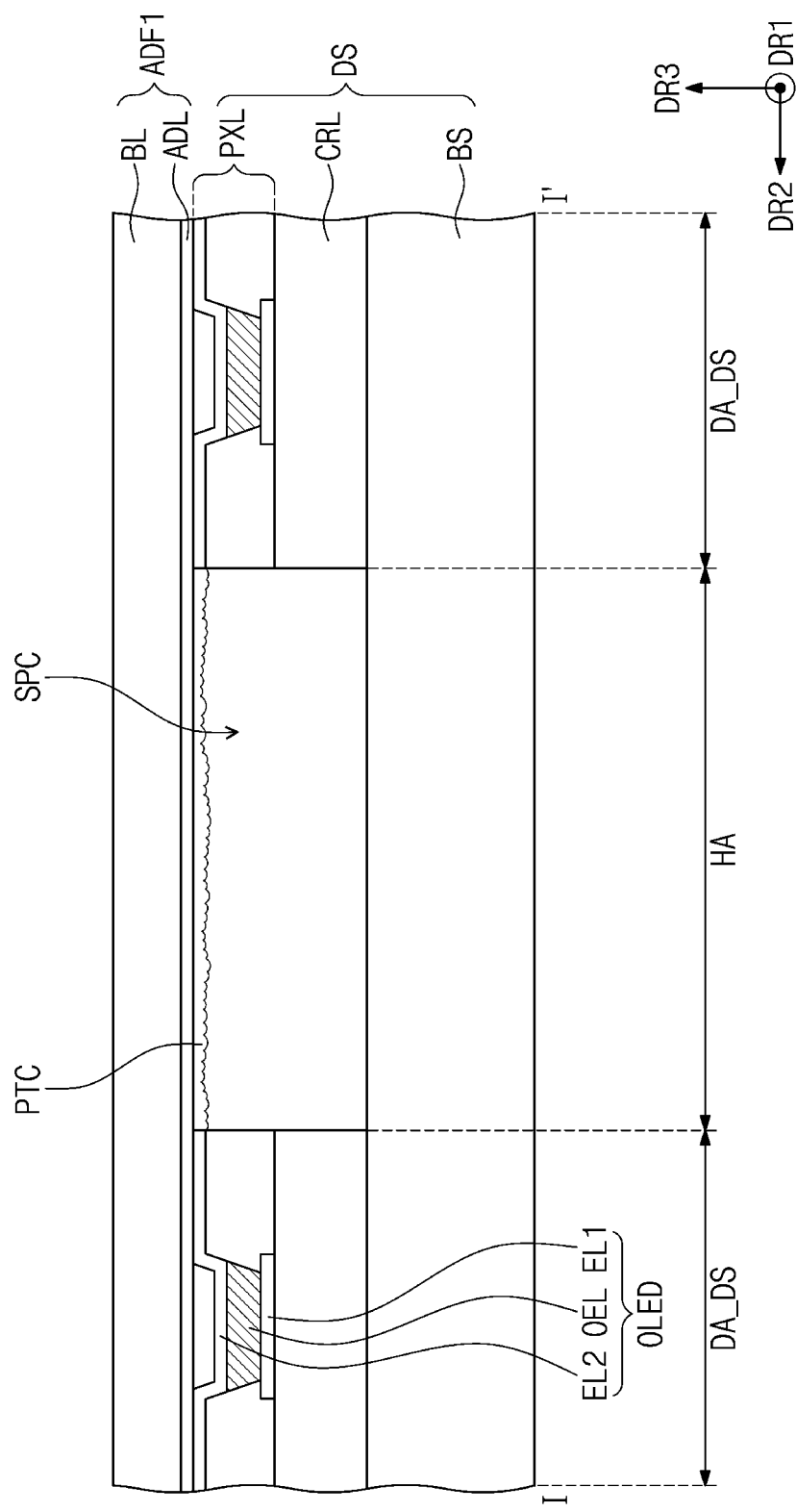

METHOD OF MANUFACTURING DISPLAY APPARATUS

CROSS-REFERENCE TO RELATED APPLICATION

This application claims priority to and the benefit of Korean Patent Application No. 10-2018-0158366, filed on Dec. 10, 2018, the entire contents of which are hereby incorporated by reference.

BACKGROUND

One or more aspects of example embodiments of the present disclosure relates to a method of manufacturing a display apparatus, and more particularly, to a method of manufacturing a display apparatus having an improved yield.

The importance of a display apparatus is increasing with the advancement of multimedia. In response thereto, various kinds of display apparatuses such as a liquid crystal display (LCD) apparatus and an organic light-emitting display (OLED) apparatus are being used.

An organic light-emitting display apparatus displays an image using an organic light-emitting element that emits light by recombining electrons and holes. The organic light-emitting display apparatus has advantages of a high response speed, a high luminance and a wide viewing angle, and of being driven, at the same time, at low power consumption.

An organic light-emitting display panel includes a display substrate in which organic light-emitting elements are arranged, and an encapsulation substrate for covering the display substrate.

SUMMARY

The present disclosure provides a display apparatus having an improved yield.

Some embodiments of the present disclosure provide a method of manufacturing a display apparatus, the method including: preparing a display substrate in which at least one hole region is defined when viewed in a planar view; disposing a first adhesive film on the display substrate; etching the hole region of the display substrate by irradiating first light in the form of laser; and peeling off the first adhesive film, wherein the first adhesive film transmits at least a portion of the first light.

In some embodiments, the first adhesive film may include: a base layer; and an adhesive layer disposed below the base layer, wherein the adhesive layer is disposed between the display substrate and the base layer in the placement of the first adhesive film.

In some embodiments in the etching of the display substrate, a groove may be defined on a region of the display substrate corresponding to the hole region as the display substrate is etched, and dust generated between inside of the groove and the first adhesive film may be attached to a bottom surface of the first adhesive film.

In some embodiments, the method may further include irradiating second light onto a region of the first adhesive film corresponding to the hole region, after the disposing of the first adhesive film on the display substrate, wherein adhesion force of the adhesive layer increases as the second light is irradiated.

In some embodiments, the adhesive layer may include a photoinitiator.

In some embodiments, the base layer may include polyethylene terephthalate (PET), and wavelength of the first light may be about 310 nm or longer.

In some embodiments, the base layer may include polyimide (PI), and wavelength of the first light may be about 475 nm or longer In some embodiments, transmittance of the first adhesive film may be about 70% or larger for the first light.

In some embodiments, the method may further include removing dust generated in the hole region, after the peeling off of the first adhesive film.

In some embodiments, the dust may be removed by a suction unit or a blowing unit.

In some embodiments, the display substrate may include: a base substrate; a circuit layer which is disposed on the base substrate and has a plurality of thin film transistors; and a pixel layer which is disposed on the circuit layer and has a plurality of organic light-emitting elements.

In some embodiments, regions corresponding to the hole region, of the pixel layer and the circuit layer of the display substrate may be etched by the first light, while the base substrate of the display substrate remains intact during the etching of the display substrate.

In some embodiments, a region, corresponding to the hole region, of the pixel layer of the display substrate may be etched by the first light, while the circuit layer and the base substrate of the display substrate remain intact during the etching of the display substrate.

In some embodiments, the method may further include: preparing an encapsulation substrate; bonding the display substrate and the encapsulation substrate after the peeling off of the first adhesive film; and forming a module hole in the hole region, wherein the module hole penetrates the display substrate and the encapsulation substrate.

In some embodiments, the hole region may include a central region and a peripheral region surrounding the central region, and the bonding of the display substrate and the encapsulation substrate may include disposing a sealing member on a region of the encapsulation substrate overlapping the peripheral region.

In some embodiments, the hole region may include a central region and a peripheral region surrounding the central region, and the forming of the module hole may include etching regions of the display substrate and the encapsulation substrate corresponding to the central region by irradiating third light in the form of laser.

In some embodiments, the method may further include: disposing a second adhesive film on at least one of a top surface of the encapsulation substrate or a bottom surface of the display substrate before the forming of the module hole; and peeling off the second adhesive film after the forming of the module hole, wherein the third light passes through the second adhesive film.

In some embodiments of the present disclosure, a method of manufacturing a display apparatus includes: preparing a display substrate and an encapsulation substrate in each of which at least one hole region is defined; forming a groove in the hole region of the display substrate; bonding the display substrate and the encapsulation substrate; and forming a module hole in the display substrate and the encapsulation substrate so as to penetrate the hole region, wherein the forming of the groove in the display substrate comprises: disposing a first adhesive film on the display substrate so as to overlap the hole region; etching the hole region of the display substrate by irradiating first light which is provided in the form of laser and at least a portion of which passes through the first adhesive film; and peeling off the first adhesive film.

BRIEF DESCRIPTION OF THE FIGURES

The above and other aspects and features of the present disclosure will become more apparent by describing in detail example embodiments thereof with reference to the accompanying drawings, wherein:

FIG. 2 is an exploded perspective view of the display apparatus illustrated in

FIG. 1;

DETAILED DESCRIPTION

Figure 1:
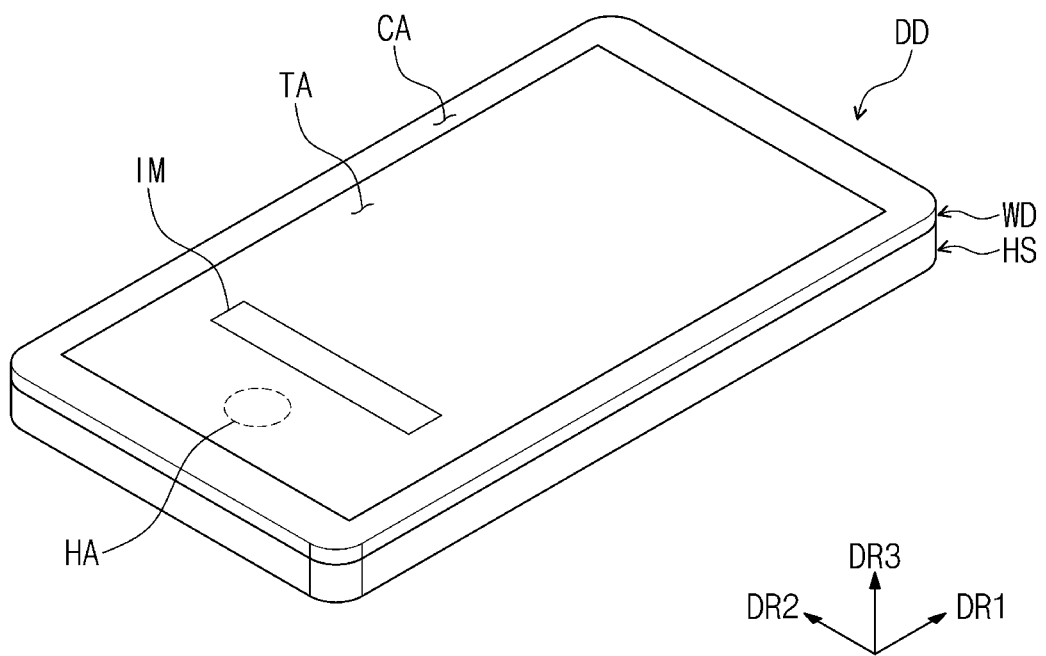
FIG. 1 is a perspective view of a display apparatus according to some example embodiments of the present disclosure.

Hereinafter, example embodiments will now be described in more detail with reference to the accompanying drawings, in which like reference numbers refer to like elements throughout. The present invention, however, may be embodied in various different forms, and should not be construed as being limited to only the illustrated embodiments herein. Rather, these embodiments are provided as examples so that this disclosure will be thorough and complete, and will fully convey the aspects and features of the present invention to those skilled in the art. Accordingly, processes, elements, and techniques that are not necessary to those having ordinary skill in the art for a complete understanding of the aspects and features of the present invention may not be described. Unless otherwise noted, like reference numerals denote like elements throughout the attached drawings and the written description, and thus, descriptions thereof will not be repeated. In the drawings, the relative sizes of elements, layers, and regions may be exaggerated for clarity.

In the following description, for the purposes of explanation, numerous specific details are set forth to provide a thorough understanding of various embodiments. It is apparent, however, that various embodiments may be practiced without these specific details or with one or more equivalent arrangements. In other instances, well-known structures and devices are shown in block diagram form in order to avoid unnecessarily obscuring various embodiments.

In the drawings, thicknesses of a plurality of layers and areas may be illustrated in an enlarged manner for clarity and ease of description thereof.

It will be further understood that the terms "comprises," "comprising," "includes" and/or "including," when used in this specification, specify the presence of stated features, integers, steps, operations, elements and/or components, but do not preclude the presence or addition of one or more other features, integers, steps, operations, elements, components and/or groups thereof.

It will be understood that when an area or element is referred to as being "on," "connected to," or "coupled to" another area or element, it may be directly on, connected, or coupled to the other area or element, or intervening areas or elements may be present therebetween. Conversely, when an area or element is referred to as being "directly on," "directly connected to," or "directly coupled to" another area or element, there are no intervening areas or elements therebetween. In addition, it will also be understood that when an area or element is referred to as being "between" two areas or elements, it can be the only area or element between the two areas or elements, or one or more intervening areas or elements may also be present.

Unless otherwise defined, all terms used herein (including technical and scientific terms) have the same meaning as commonly understood by those skilled in the art to which this invention pertains. It will be further understood that terms, such as those defined in commonly used dictionaries, should be interpreted as having a meaning that is consistent with their meaning in the context of the relevant art and will not be interpreted in an ideal or excessively formal sense unless clearly defined in the present specification.

Further, the use of "may" when describing embodiments of the present invention refers to "one or more embodiments of the present invention." As used herein, the terms "use," "using," and "used" may be considered synonymous with the terms "utilize," "utilizing," and "utilized," respectively. Also, the term "exemplary" is intended to refer to an example or illustration.

It will be understood that, although the terms "first," "second," "third," etc., may be used herein to describe various elements, components, regions, layers and/or sections, these elements, components, regions, layers and/or sections should not be limited by these terms. These terms are used to distinguish one element, component, region, layer or section from another element, component, region, layer or section. Thus, a first element, component, region, layer or section described below could be termed a second element, component, region, layer or section, without departing from the spirit and scope of the present invention.

When a certain embodiment may be implemented differently, a specific process order may be performed differently from the described order. For example, two consecutively described processes may be performed substantially at the same time or performed in an order opposite to the described order.

Various embodiments are described herein with reference to sectional illustrations that are schematic illustrations of embodiments and/or intermediate structures. As such, variations from the shapes of the illustrations as a result, for example, of manufacturing techniques and/or tolerances, are to be expected. Thus, embodiments disclosed herein should not be construed as limited to the particular illustrated shapes of regions, but are to include deviations in shapes that result from, for instance, manufacturing. For example, an implanted region illustrated as a rectangle will, typically, have rounded or curved features and/or a gradient of implant concentration at its edges rather than a binary change from implanted to non-implanted region. Likewise, a buried region formed by implantation may result in some implantation in the region between the buried region and the surface through which the implantation takes place. Thus, the regions illustrated in the drawings are schematic in nature and their shapes are not intended to illustrate the actual shape of a region of a device and are not intended to be limiting.

Expressions such as "at least one of," when preceding a list of elements, modify the entire list of elements and do not only modify the individual elements of the list. For the purposes of this disclosure, "at least one of X, Y, and Z" and "at least one selected from the group consisting of X, Y, and Z" may be construed as X only, Y only, Z only, or any combination of two or more of X, Y, and Z, such as, for instance, XYZ, XYY, YZ, and ZZ. Like numbers refer to like elements throughout. As used herein, the term "and/or" includes any and all combinations of one or more of the associated listed items.

Spatially relative terms, such as "beneath", "below", "lower", "above", "upper" and the like, may be used herein for ease of description to describe one element or feature's relationship to another element(s) or feature(s) as illustrated in the figures. It will be understood that the spatially relative terms are intended to encompass different orientations of the device in use or operation in addition to the orientation depicted in the figures. For example, if the device in the figures is turned over, elements described as "below" or "beneath" or "under" other elements or features would then be oriented "above" the other elements or features. Thus, the example terms "below" and "under" can encompass both an orientation of above and below. The device may be otherwise oriented (e.g., rotated 90 degrees or at other orientations) and the spatially relative descriptors used herein should be interpreted accordingly.

In the following examples, the x-axis, the y-axis and the z-axis are not limited to three axes of a rectangular coordinate system, and may be interpreted in a broader sense. For example, the x-axis, the y-axis, and the z-axis may be perpendicular to one another, or may represent different directions that are not perpendicular to one another.

As used herein, the terms "substantially," "about," "approximately" and similar terms are used as terms of approximation and not as terms of degree, and are intended to account for the inherent deviations in measured or calculated values that would be recognized by those of ordinary skill in the art. Further, these terms as used herein are inclusive of the stated value and means within an acceptable range of deviation for the particular value as determined by one of ordinary skill in the art, considering the measurement in question and the error associated with measurement of the particular quantity (i.e., the limitations of the measurement system). For example, "about" may mean within one or more standard deviations, or within ±30%, 20%, 10%, 5% of the stated value.

Figure 2:
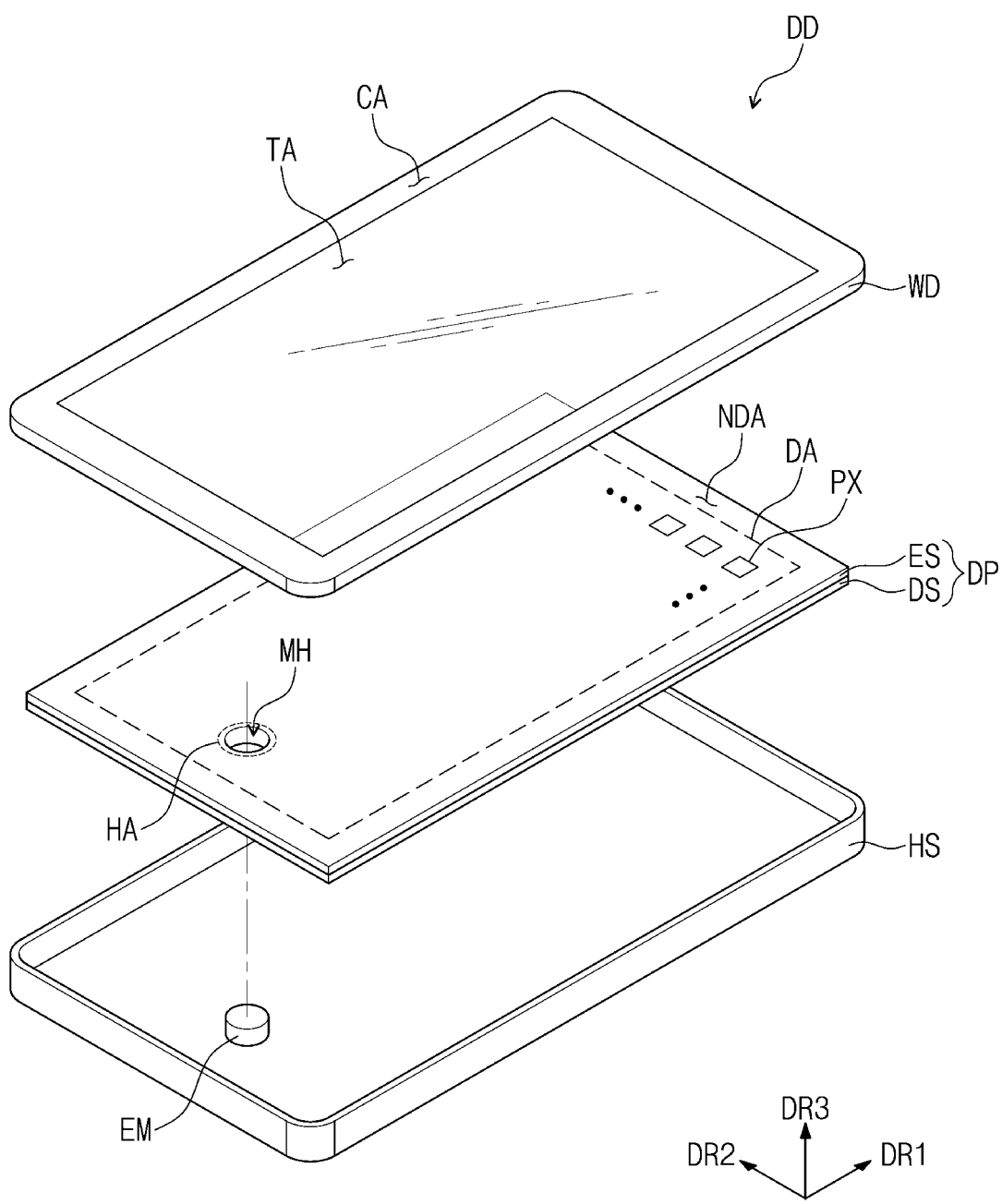

FIG. 1 is a perspective view of a display apparatus according to some example embodiments of the present disclosure, and FIG. 2 is an exploded perspective view of the display apparatus illustrated in FIG. 1.

Referring to FIGS. 1 and 2, a display apparatus DD according to some embodiments of the present disclosure may be an apparatus that is activated according to an electrical signal. The display apparatus DD may include a tablet computer, a laptop computer, a general computer, a smart TV, or the like.

In FIGS. 1 and 2, the display apparatus DD provides a display surface that is parallel to each of a first direction DR1 and a second direction DR2 crossing each other, and displays an image IM toward a third direction DR3. The display surface on which the image IM is displayed may correspond to a front surface of the display apparatus DD.

The display apparatus DD according to some embodiments of the present disclosure has a substantially rectangular shape having a long side in the first direction DR1, and a short side in the second direction DR2 perpendicular to the first direction DR1. The shape of the display apparatus DD is specified as an example for convenience of description, but is not limited to a particular shape.

As illustrated in FIGS. 1 and 2, the display apparatus DD includes a window WD, a display panel DP, a housing HS, and an electronic module EM. The display apparatus DD may further include various components such as a power supply module, an optical member, a protective member, and a heat dissipation member.

The window WD provides the front surface of the display apparatus DD, and protects the display panel DP. By way of example, the window WD may include a glass substrate, a sapphire substrate, or a plastic film. The window WD may have a multi-layer structure or a single layer structure. By way of example, the window WD may have a laminated structure of a plurality of plastic films bonded by an adhesive, or may also have a laminated structure of a glass substrate and a plastic film bonded by an adhesive.

A front surface of the window WD may be divided into a light-transmitting region TA and a light-shielding region CA. The light-transmitting region TA is defined as a region which transmits the image IM. A user views the image IM through the light-transmitting region TA.

The light-shielding region CA is adjacent to the light-transmitting region TA. The light-shielding region CA may surround (e.g., partially or completely surround) the light-transmitting region TA. The light-shielding region CA may have a predetermined color. However, the light-shielding region CA is illustrated by way of example only, and the light-shielding region CA may be adjacent to only one or more sides of the light-transmitting region TA, or may be omitted.

A normal (e.g., perpendicular) direction of the front surface of the display apparatus DD corresponds to a thickness direction of the display apparatus DD. For convenience of description, the normal direction of the front surface of the display apparatus DD, that is, a direction in which the image IM is provided from the display apparatus DD is defined as an upward direction, and a direction opposite to the upward direction is defined as a downward direction. In some embodiments, the upward and downward directions are parallel to the third direction DR3, which is defined as a direction perpendicular to the first direction DR1 and the second direction DR2. The third direction DR3 may be a reference direction in which a front surface of components to be described in more detailed is distinguished from a rear surface thereof. However, the upward direction or the downward direction is a relative concept, and may be converted to another direction.

The display panel DP is disposed below the window WD (see FIG. 2). The display panel DP displays the image IM.

The display panel DP according to some embodiments of the present disclosure may be an organic electro-luminescence display panel. Specifically, the display panel DP according to some embodiments of the present disclosure may include a plurality of organic light-emitting elements OLED (see FIGS. 5 to 12). However, the present disclosure is not limited to the particular type of the display panel DP. For example, the display panel DP may be a liquid crystal display panel, an electro-wetting display panel, a nano-crystal display panel, or a quantum dot light-emitting display panel. For purposes of the description herein, the display panel DP is described as the case of an organic electro-luminescence.

When viewed in a plane, the display panel DP may have a display region DA, a non-display region NDA, and a hole region HA defined therein.

The display region DA is a region in which the image IM is displayed. In some embodiments, the display region DA may be defined at the center of the display panel DP. By way of example, the display region DA may overlap the light-transmitting region TA when viewed in a plane or a planar view.

The display panel DP may include a plurality of pixels PX which are arranged in the display region DA and emit light for generating an image. The pixels PX may be arranged in a matrix form in the display region DA. The pixels PX display light in accordance with an electrical signal.

The non-display region NDA is a region in which the image IM is not displayed, and may have a frame shape surrounding the display region DA. By way of example, the non-display region NDA may overlap the light-shielding region CA when viewed in a plane or a planar view.

According to some embodiments, at least one module hole MH penetrating the display panel DP in the third direction DR3 may be defined in the display panel DP. The module hole MH may be a through-hole extending from a front surface to a rear surface of the display panel DP. Components that are disposed in the rear surface of the display panel DP and overlap the module hole MH may be viewed through the module hole MH from the front surface of the display panel DP. Although illustrated to have a cylindrical shape having a height in the third direction DR3 in FIG. 2, the module hole MH may be provided in various shapes such as a polygonal column, an elliptical column, and a truncated cone, and is not limited to any one shape.

The module hole MH overlaps the electronic module EM when viewed in a plane or a planar view. The electronic module EM may be inserted in the module hole MH. The electronic module EM may receive an external input through the module hole MH. The electronic module EM receives a signal inputted through the module hole MH, and provides the signal to the display panel DP. The electronic module EM may have a size that may be accommodated in the module hole MH.

The hole region HA may be defined to surround the module hole MH. The hole region HA may be spaced apart from the non-display region NDA with the display region DA therebetween when viewed in a plane or a planar view. By way of example, the hole region HA may be surrounded by the display region DA.

The display panel DP includes a display substrate DS and an encapsulation substrate ES. In some embodiments, each of the display substrate DS and the encapsulation substrate ES include a glass material. The display substrate DS may be provided in a form of being bonded to the encapsulation substrate ES.

The housing HS is disposed in the rear surface of the display panel DP. The housing HS may be combined with the window WD to provide a rear surface of the display apparatus DD. The housing HS may be combined with the window WD to define an internal space, and the display panel DP, the electronic module EM, and various other electronic parts or optical parts are accommodated in the internal space. The housing HS may include a material having a relatively high stiffness. By way of example, the housing HS may include a plurality of frames and/or plates constituted of glass, plastic, metal, and the like. The housing HS may securely protect the components of the display apparatus DD accommodated in the internal space from external impact.

The display panel DP may further include an input-sensing unit (not illustrated). That is, the display panel DP may sense an external input. An input signal may include various kinds of inputs provided from outside of the display apparatus DD. For example, the input signal may include various kinds of external inputs such as a part of a user's body, light, heat and pressure. In some embodiments, the input signal may be a touch signal.

In some embodiments where the input signal is a touch signal, the display panel DP may sense an input signal applied to the display region DA, and may not sense an input signal applied to the non-display region NDA. Alternatively, in other embodiments of the present disclosure, the display panel DP may sense an input signal applied to the non-display region NDA, and may not sense an input signal applied to the display region DA. Alternatively, the display panel DP may also sense all input signals applied to the front surface of the display panel DP including the display region DA and the non-display region NDA. The display panel DP according to some embodiments of the present disclosure may sense an input signal applied to various regions according to an internal configuration design, and is not limited to any one embodiment.

The display apparatus DD may further include a reflection-preventing member (not illustrated) disposed between the display panel DP and the window WD. The reflection-preventing member may prevent external light incident from the outside of the display apparatus DD from being reflected by the display panel DP to be viewed by a user. By way of example, the reflection-preventing member may include a polarization layer and a phase retardation layer.

According to some embodiments, the module hole MH described above may be defined in the reflection-preventing member described above. Accordingly, the electronic module EM may penetrate both the display panel DP and the reflection-preventing member.

Figure 3:
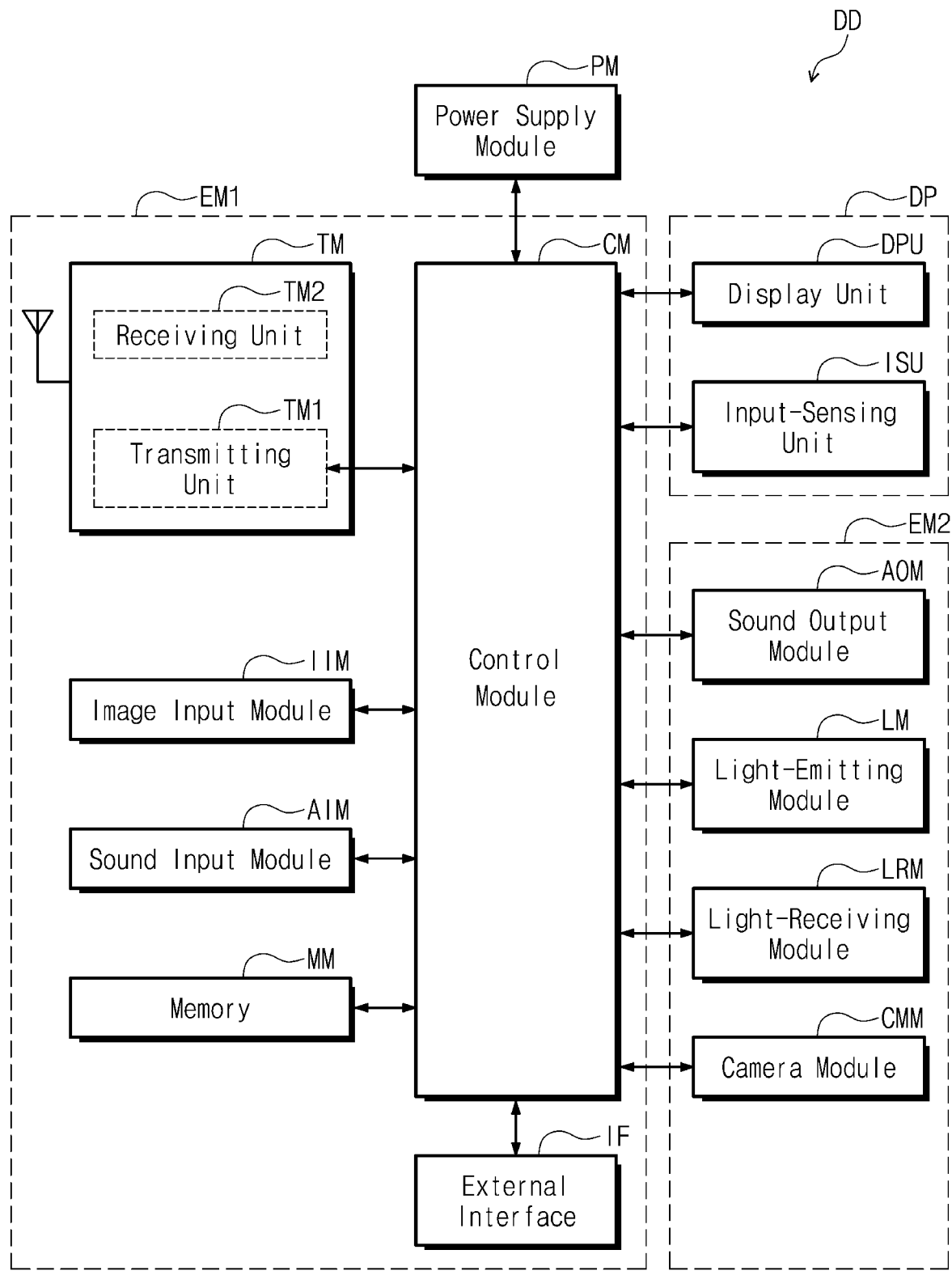
FIG. 3 is a block diagram of the display apparatus illustrated in FIG. 1.

FIG. 3 is a block diagram of the display apparatus illustrated in FIG. 1.

Referring to FIG. 3, the display apparatus DD may include a power supply module PM, a first electronic module EM1, and a second electronic module EM2. The power supply module PM may supply power required for overall operations of the display apparatus DD. The power supply module PM may include a battery module.

The first electronic module EM1 and the second electronic module EM2 may include various functional modules for operating the display apparatus DD. The first electronic module EM1 may be directly mounted on a printed circuit board (not illustrated) or a flexible circuit board electrically connected to the display panel DP.

The first electronic module EM1 may include a control module CM, a wireless communication module TM, an image input module IIM, a sound input module AIM, memory MM, and an external interface IF.

The control module CM may control overall operations of the display apparatus DD. The control module CM may be a microprocessor. By way of example, the control module CM may activate or deactivate the display panel DP. The control module CM may control other modules such as the image input module IIM and the sound input module AIM, for example, on the basis of a touch signal received from the display panel DP.

The wireless communication module TM may transmit/receive a radio signal to/from another terminal using, for example, a Bluetooth or Wi-Fi channel. The wireless communication module TM may transmit/receive a voice signal using a general communication channel. The wireless communication module TM may include a transmitting unit TM1 for modulating and transmitting a signal to be transmitted, and a receiving unit TM2 for demodulating a received signal.

The image input module IIM may process an image signal so as to convert the processed image signal into image data that may be displayed on the display panel DP. The sound input module AIM may receive an external sound signal using, for example, a microphone in a recording mode, a voice recognition mode, or the like so as to convert the received external sound signal into electrical voice data.

The external interface IF serves as an interface to which an external charger, a wired/wireless data port, a card socket (e.g., a memory card and a SIM/USIM card), and the like are connected.

The second electronic module EM2 may include a sound output module AOM, a light-emitting module LM, a light-receiving module LRM, a camera module CMM, and the like. The components described above may be mounted on a printed circuit board, a flexible circuit board or the like to be electrically connected to the display panel DP or the first electronic module EM1.

The sound output module AOM may convert sound data received from the wireless communication module TM or sound data stored in the memory MM so as to output the converted sound data to the outside.

The light-emitting module LM may generate and output light. By way of example, the light-emitting module LM may output infrared rays. The light-emitting module LM may include an LED element. The light-receiving module LRM may sense infrared rays. The light-receiving module LRM may be activated when infrared rays having a predetermined level or higher are sensed. The light-receiving module LRM may include a CMOS sensor. After infrared rays generated by the light-emitting module LM are outputted, the infrared rays may be reflected by an external object (e.g., a user's finger or face), and the reflected infrared rays may be incident on the light-receiving module LRM. The camera module CMM may take an external image.

The electronic module EM illustrated in FIG. 2 may receive an external input transmitted through the module hole MH, or may provide an output through the module hole MH. The electronic module EM may be any one of modules constituting the first electronic module EM1 and the second electronic module EM2. By way of example, the electronic module EM may be a camera, a speaker, or a sensor of light, heat or the like. The electronic module EM may sense an external subject received through the module hole MH, or may provide a sound signal such as a voice to the outside through the module hole MH. Remaining components of the first electronic module EM1 and the second electronic module EM2 may be disposed at other location and are not illustrated. The electronic module EM may also include some modules provided in plurality among modules constituting the first electronic module EM1 and the second electronic module EM2, and is not limited to any one embodiment.

Meanwhile, the display apparatus DD according to some embodiments of the present disclosure may further include a transparent member (not illustrated) disposed between the electronic module EM and the display panel DP. The transparent member may be an optically transparent film so that an external input transmitted through the module hole MH is transmitted to the electronic module EM through the transparent member. The transparent member may be attached to the rear surface of the display panel DP, or disposed between the display panel DP and the electronic module EM without a separate adhesive layer.

According to some embodiments of the present disclosure, a separate space provided for the electronic module EM on an outer side of the non-display region NDA may be omitted by forming the module hole MH in the display panel DP. Additionally, by defining the module hole MH inside the hole region HA surrounded by the display region DA, the electronic module EM may be disposed so as to overlap the light-transmitting region TA instead of the light-shielding region CA. Accordingly, the area of the light-shielding region CA may be reduced, so that a display apparatus DD having a narrow bezel may be implemented. Additionally, in the case that the electronic module EM is accommodated in the module hole MH, a thin display apparatus DD may be implemented.

Figure 4:
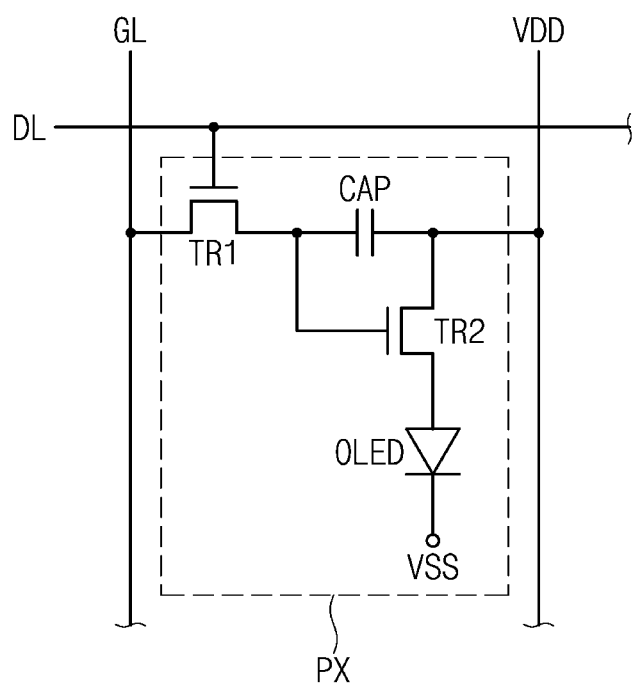
FIG. 4 is an equivalent circuit diagram of a pixel illustrated in FIG. 2.

FIG. 4 is an equivalent circuit diagram of a pixel illustrated in FIG. 2.

For convenience of description, illustrated in FIG. 4 is an equivalent circuit diagram of one pixel PX among a plurality of pixels PX illustrated in FIG. 2. Each of the plurality of pixels PX according to some embodiments of the present disclosure may have a structure corresponding to that of the pixel PX illustrated in FIG. 4. Additionally, the configuration of the pixel PX is not limited to the structure illustrated in FIG. 4, and may be modified and implemented.

Referring to FIG. 4, the pixel PX may include a first transistor TR1, a capacitor CAP, a second transistor TR2, and an organic light-emitting element OLED. The first transistor TR1 may include a control electrode connected to a first signal line DL, an input electrode connected to a second signal line GL, and an output electrode.

The first transistor TR1 may be a switching element for controlling on and off of the pixel PX. The first transistor TR1 may transmit or block a data signal transmitted through the second signal line GL in response to a scan signal transmitted through the first signal line DL.

The capacitor CAP may include a first capacitor electrode connected to the first transistor TR1, and a second capacitor electrode receiving a first power supply voltage VDD. The capacitor CAP is charged with a quantity of electric charge corresponding to the difference between a voltage corresponding to the data signal received from the first transistor TR1 and the first power supply voltage VDD.

The second transistor TR2 may include a control electrode connected to the output electrode of the first transistor TR1 and the first capacitor electrode of the capacitor CAP, an input electrode receiving the first power supply voltage VDD, and an output electrode. The output electrode of the second transistor TR2 may be connected to the organic light-emitting element OLED. The second transistor TR2 may be a driving thin film transistor for controlling the organic light-emitting element OLED.

The second transistor TR2 may control a driving current flowing in the organic light-emitting element OLED in response to a quantity of electric charge stored in the capacitor CAP. Turn-on time of the second transistor TR2 may be determined depending on the quantity of electric charge charged in the capacitor CAP. Substantially, the output electrode of the second transistor TR2 may supply a voltage lower than the first power supply voltage VDD to the organic light-emitting element OLED.

The organic light-emitting element OLED includes a light-emitting material. The organic light-emitting element OLED may generate light having a color corresponding to the light-emitting material. The color of the light generated by the organic light-emitting element OLED may be one of a red color, a green color, a blue color, and a white color.

Figure 5:
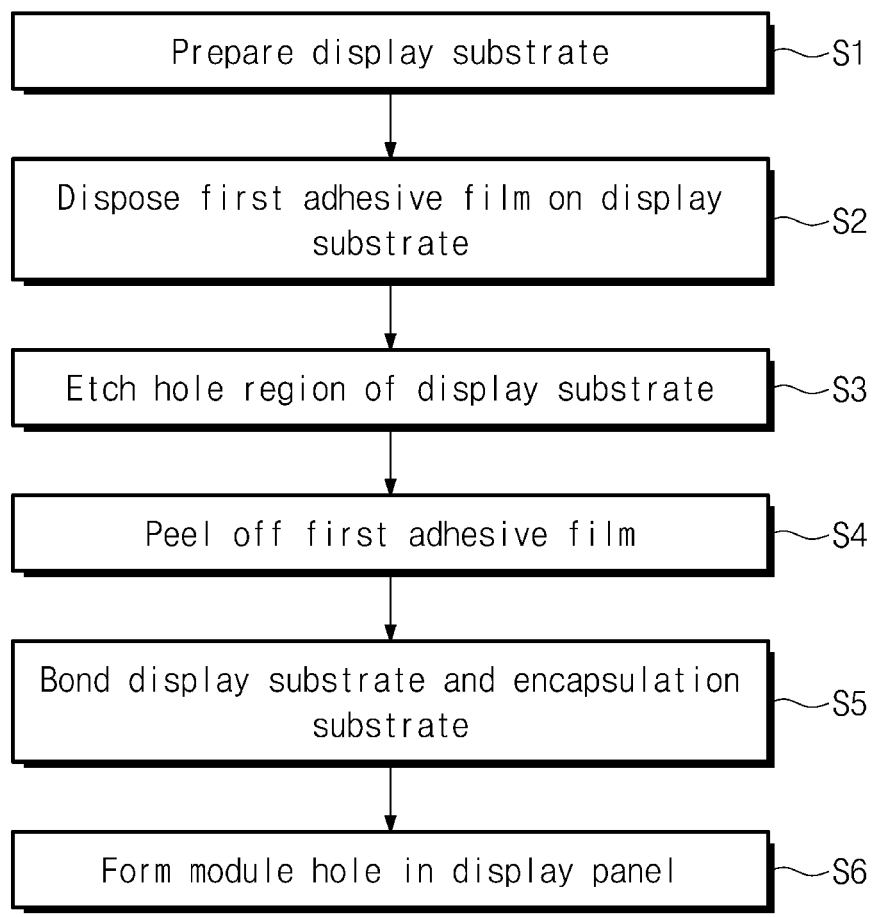
FIG. 5 is a flowchart of a method of manufacturing the display apparatus according to some embodiments of the present disclosure.
Figure 6:
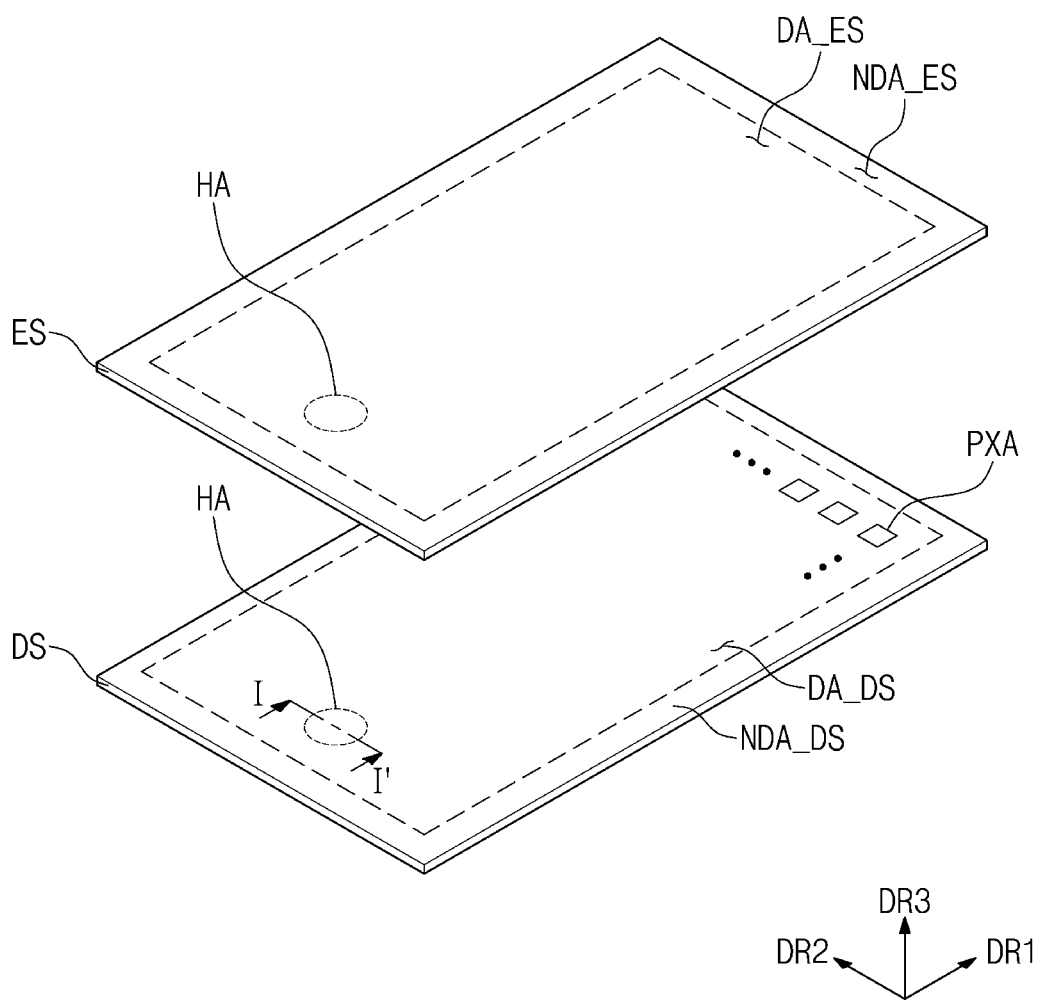
FIG. 6 illustrates a display substrate and an encapsulation substrate before a module hole is formed.

FIG. 5 is a flowchart of a method of manufacturing the display apparatus according to some embodiments of the present disclosure, and FIG. 6 illustrates the display substrate and the encapsulation substrate before the module hole is formed.

FIGS. 7 to 14 illustrate a process of the method of manufacturing the display apparatus according to some embodiments of the present disclosure. FIGS. 7 to 14 correspond to a cross-sectional view taken along line I-I' illustrated in FIG. 6.

Hereinafter, the method of manufacturing the display apparatus according to some embodiments of the present disclosure will be described in more detail with reference to FIG. 5 together with FIGS. 6 to 14.

Figure 7:
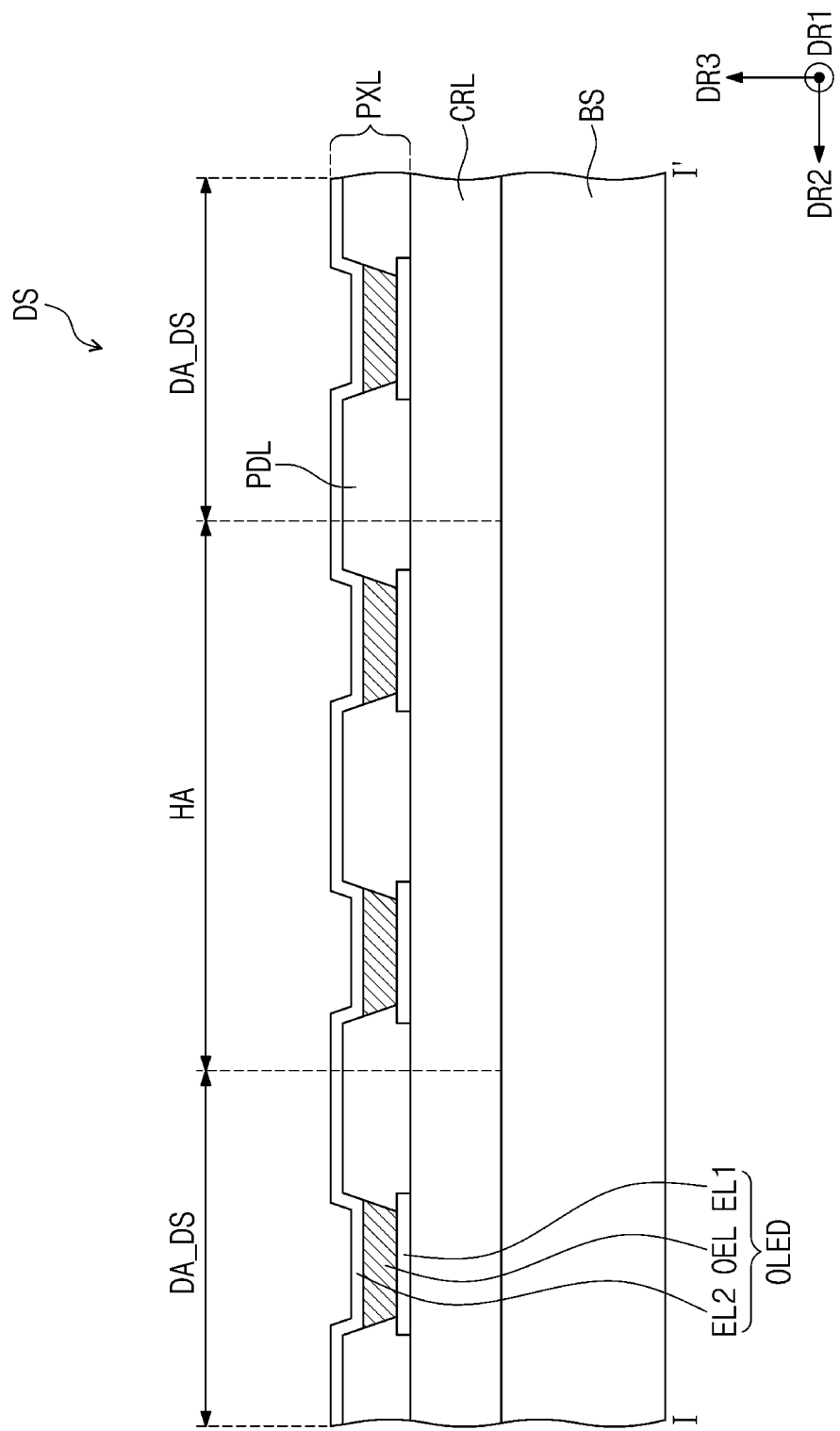
FIGS. 7 to 14 illustrate a process of the method of manufacturing the display apparatus according to some embodiments of the present disclosure.

First, referring to FIGS. 5 to 7, the display substrate DS and the encapsulation substrate ES are prepared in step S1 (see FIG. 5). Illustrated in FIG. 6 are the display substrate DS and the encapsulation substrate ES before the module hole MH (see FIG. 2) is formed.

The display substrate DS may include a base substrate BS, a circuit layer CRL, and a pixel layer PXL. The circuit layer CRL and the pixel layer PXL may include components of the pixels PX.

The pixel PX may be disposed in the display region DA and the hole region HA. The pixel PX may generate light to implement the image IM. The pixel PX may be provided in plurality to be arranged in the display region DA.

The base substrate BS may define a rear surface of the display panel DP. The base substrate BS may be an insulating substrate. By way of example, the base substrate BS may be composed of various materials, for example, such as glass and plastic.

The circuit layer CRL may be disposed on the base substrate BS. The circuit layer CRL may include a plurality of thin film transistors TR1 and TR2 (see FIG. 4) and a plurality of signal lines DL and GL (see FIG. 4) for driving a plurality of organic light-emitting elements OLED.

The display panel DP according to some embodiments of the present disclosure may further include a functional layer (not illustrated) disposed between the base substrate BS and the circuit layer CRL. The functional layer may be formed directly on the base substrate BS so as to cover a front surface of the base substrate BS.

The functional layer may include an inorganic material. The functional layer may include a barrier layer and/or a buffer layer. The functional layer may prevent oxygen or moisture from permeating the circuit layer CRL or the pixel layer PXL through the base substrate BS, and allow the circuit layer CRL to be stably formed on the base substrate BS. The kind of a material of the functional layer is not particularly limited in embodiments of the present disclosure. In some embodiments of the present disclosure, the functional layer may be omitted.

The pixel layer PXL may be disposed on the circuit layer CRL. The pixel layer PXL may include the plurality of organic light-emitting elements OLED, and a pixel defining layer PDL partitioning the organic light-emitting elements OLED. One organic light-emitting element OLED of the pixel layer PXL, and at least one thin film transistor of the circuit layer CRL connected to the one organic light-emitting element OLED may define a pixel PX.

The organic light-emitting element OLED may include a first electrode EL1, a second electrode EL2, and a light-emitting layer OEL. The first electrode EL1 may be a pixel electrode or an anode. The second electrode EL2 may be a common electrode or a cathode.

The pixel defining layer PDL may be disposed on the first electrode EL1. Specifically, the pixel defining layer PDL may cover a portion of the first electrode EL1, and expose a remaining portion thereof. Light-emitting regions may be defined by the pixel defining layer PDL.

The light-emitting layer OEL may be disposed between the first electrode EL1 and the second electrode EL2. Specifically, the light-emitting layer OEL may be disposed in a light-emitting region PXA defined by the pixel defining layer PDL.

A plurality of common layers in addition to the light-emitting layer OEL may further be disposed between the first electrode EL1 and the second electrode EL2. Specifically, a hole injection layer, a hole transport layer, the light-emitting layer, an electron transport layer, and an electron injection layer may be sequentially laminated between the first electrode EL1 and the second electrode EL2. Additionally, at least one of a hole blocking layer, a hole buffer layer, or an electron blocking layer may further be disposed between the first electrode EL1 and the second electrode EL2.

Figure 8:
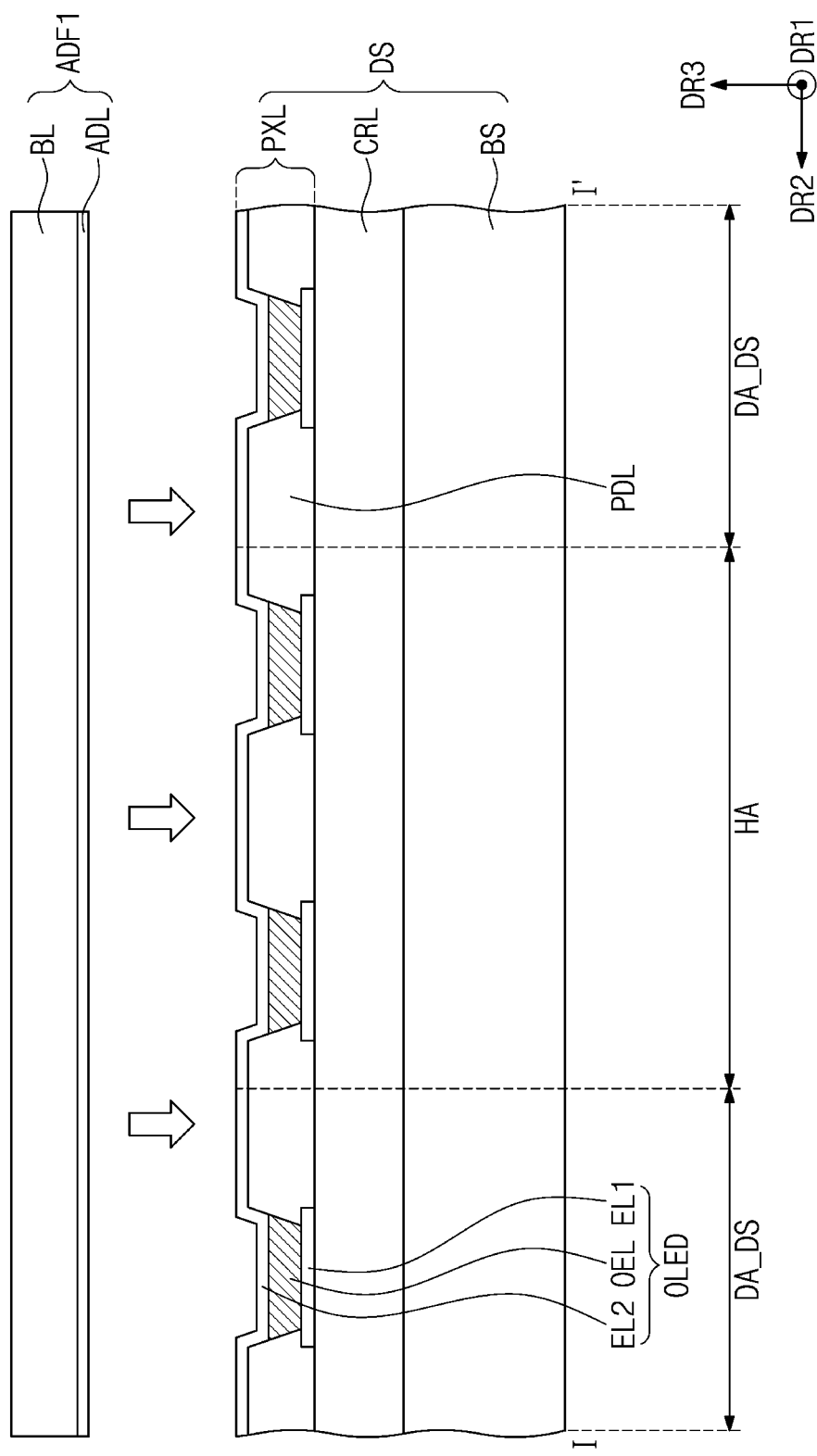

Thereafter, a first adhesive film ADF1 is disposed on the display substrate DS in step S2 (see FIG. 5), as illustrated in FIG. 8. The first adhesive film ADF1 covers a region of a top surface of the display substrate DS corresponding to the hole region HA. The first adhesive film ADF1 is illustrated to be disposed on the whole of the top surface of the display substrate DS in FIG. 8 (e.g., covering the entire top surface), however, the present disclosure is not limited thereto or thereby. Whether or not the first adhesive film ADF1 covers the display region DA and the non-display region NDA in various embodiments is not particularly limited when a region occupied by the first adhesive film ADF1 more than covers, when viewed in a plane or planar view, the hole region HA.

The first adhesive film ADF1 may have optical transparency. Specifically, the first adhesive film ADF1 may transmit at least a portion of light having a predetermined wavelength. According to some embodiments, the transmittance of the first adhesive film ADF1 for light having a predetermined wavelength may be about 70% or larger.

According to some embodiments, the first adhesive film ADF1 includes a base layer BL and an adhesive layer ADL.

The base layer BL constitutes a body of the first adhesive film ADF1.

By way of example, the first adhesive film ADF1 may include polyethylene terephthalate (PET) or polyimide (PI), however, the material of the base layer BL is not particularly limited.

The adhesive layer ADL is disposed below the base layer BL. The adhesive layer ADL may be provided in the form of being coated on a bottom surface of the base layer BL. When the first adhesive film ADF1 is disposed on the display substrate DS, the adhesive layer ADL may be disposed between the base layer BL and the top surface of the display substrate DS so as to bond the base layer BL and the display substrate DS.

Figure 9:
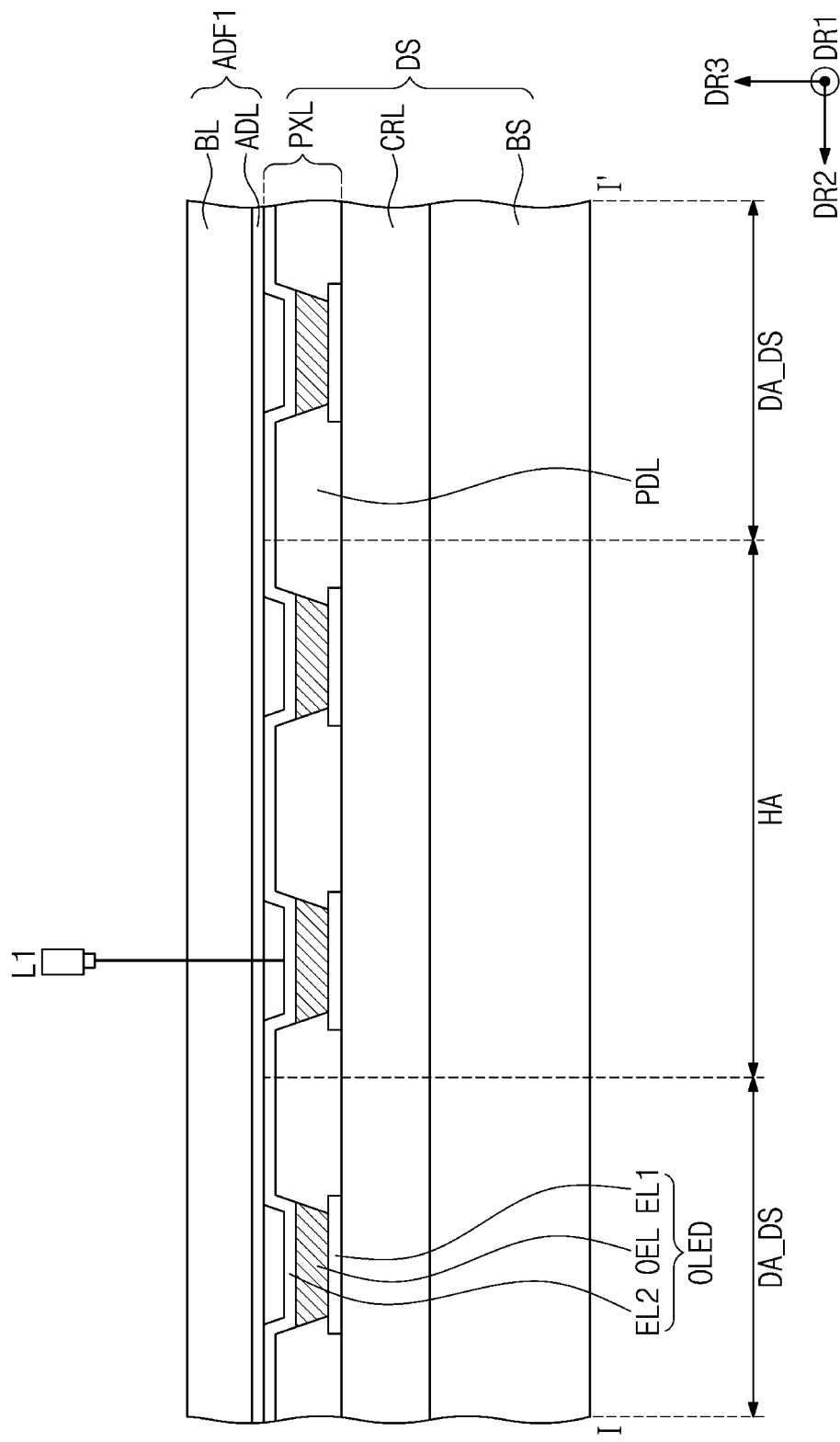

Thereafter, as illustrated in FIG. 9, first light L1 is irradiated onto the first adhesive film ADF1 and the display substrate DS in step S3 (see FIG. 5). The first light L1 may be irradiated onto the hole region HA. The first light L1 may be provided to the first adhesive film ADF1 and the display substrate DS in the form of laser. By way of example, the first light L1 may be UV laser light, femtosecond laser light, picosecond laser light, visible light laser light, or the like.

The first light L1 may pass through the first adhesive film ADF1. Accordingly, the first adhesive film ADF1 is not etched by the first light L1. In some embodiments, the transmittance of the first adhesive film ADF1 for the first light L1 may be about 70% or larger.

According to some embodiments, the transmittance of the first adhesive film ADF1 for the first light L1 may be different depending on the material of the first adhesive film ADF1. Accordingly, the wavelength of the first light L1 may be set so that the transmittance of the first adhesive film ADF1 for the first light L1 is a predetermined value or larger. By way of example, the wavelength of the first light L1 may be about 310 nm or longer in the case that the first adhesive film ADF1 includes polyethylene terephthalate (PET), and the wavelength of the first light L1 may be about 475 nm or longer in the case that the first adhesive film ADF1 includes polyimide (PI).

The first light L1 that has passed through the first adhesive film ADF1 etches the hole region HA of the display substrate DS. A groove SPC may be formed in the etched hole region HA. The groove SPC has a shape that is recessed downward from the top surface of the display substrate DS. An etching depth of the display substrate DS, that is, a depth of the groove SPC, may be set by adjusting irradiation time of the first light L1 according to some embodiments. By way of example, in FIG. 10A, regions of the pixel layer PXL and the circuit layer CRL, corresponding to the hole region HA are etched by the first light L1, while the base substrate BS is not etched by the first light L1. However, embodiments of the present disclosure are not limited thereto. In some embodiments, only a region of the pixel layer PXL corresponding to the hole region HA may be etched by the first light L1, and the circuit layer CRL and the base substrate BS may remain.

As illustrated in FIG. 10A, dust PTC may be generated inside the groove SPC as the pixel layer PXL and the circuit layer CRL are etched by the first light L1 (see FIG. 9). The dust PTC inside the groove SPC may be attached to a bottom surface of the first adhesive film ADF1 by the adhesive layer ADL of the first adhesive film ADF1. Accordingly, the first adhesive film ADF1 may perform a dust collection function.

According to some embodiments of the present disclosure, an electric field may be applied to the inside of the groove SPC so that the dust PTC dispersed inside the groove SPC may effectively move toward the first adhesive film ADF1.

Figure 10B:
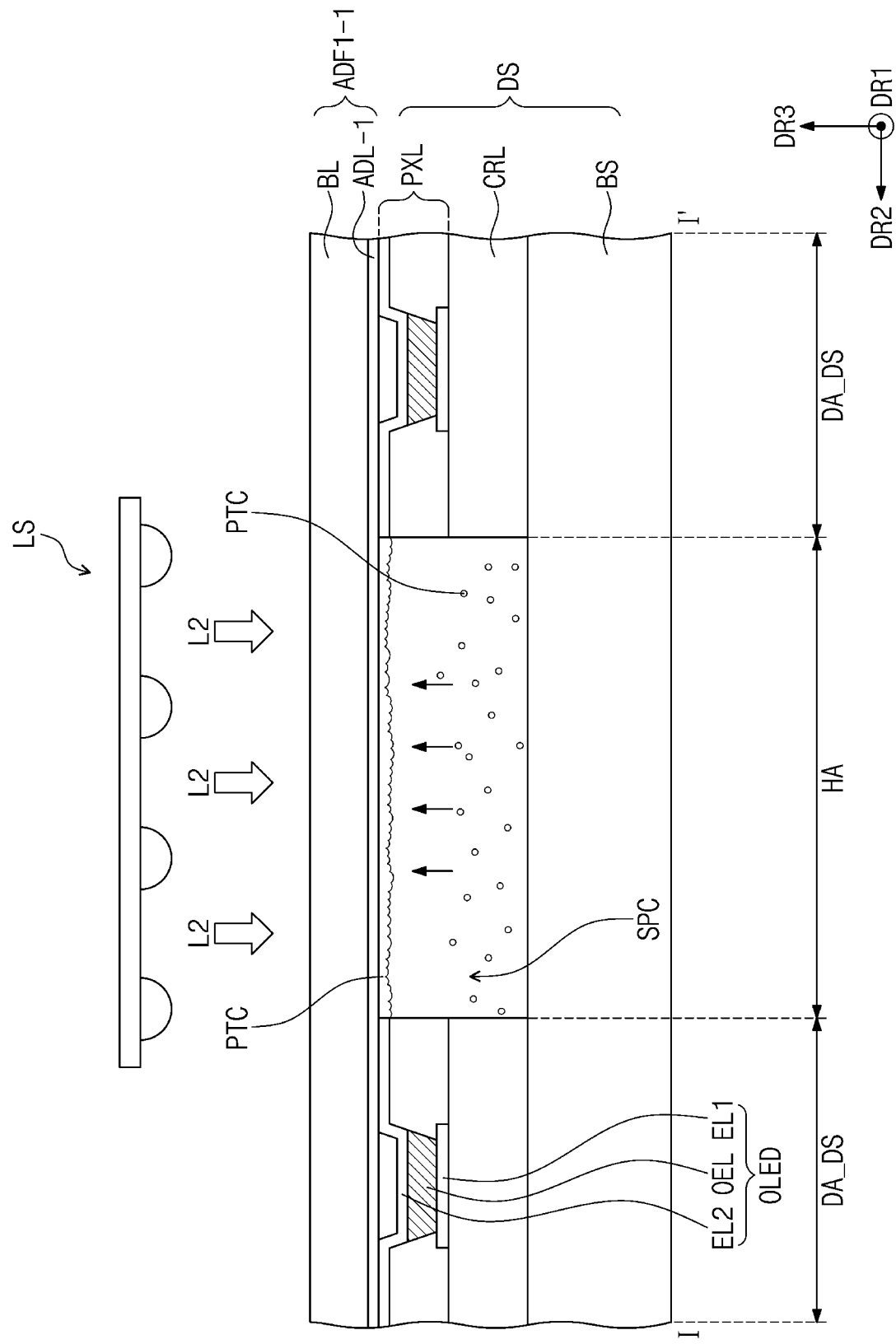

As illustrated in FIG. 10B, according to some embodiments of the present disclosure, an adhesive layer ADL-1 of a first adhesive film ADF1-1 may have a material different from that in some of the embodiments described above. The adhesive layer ADL-1 may include a photoinitiator. Accordingly, according to some embodiments, the adhesion force of the adhesive layer ADL-1 may increase as light is irradiated onto the adhesive layer ADL-1. That is, the adhesive layer ADL-1 (located immediately after the first adhesive film ADF1-1) is disposed on a display substrate DS and may not have adhesion force, or may have weaker adhesion force as compared with the adhesive layer ADL described above.

Specifically, second light L2 is irradiated onto the first adhesive film ADF1-1 after the first adhesive film ADF1-1 is disposed on the display substrate DS. The kind or type of the second light L2 according to various embodiments of the present disclosure is not particularly limited. By way of example, as illustrated in FIG. 10B, the second light L2 may be provided in the form of a light source unit LS including at least one diode. Alternatively, in other embodiments of the present disclosure, the second light L2 may also be provided in the form of laser and irradiated onto the first adhesive film ADF1-1 through a laser oscillator.

When the second light L2 is irradiated onto the adhesive layer ADL-1 of the first adhesive film ADF1-1, bonding between molecules included in the adhesive layer ADL-1 may become stronger. As the adhesion force of the adhesive layer ADL-1 becomes stronger, dust PTC generated inside a groove SPC in an etching process may be attached to a bottom surface of the adhesive layer ADL-1.

Figure 11:
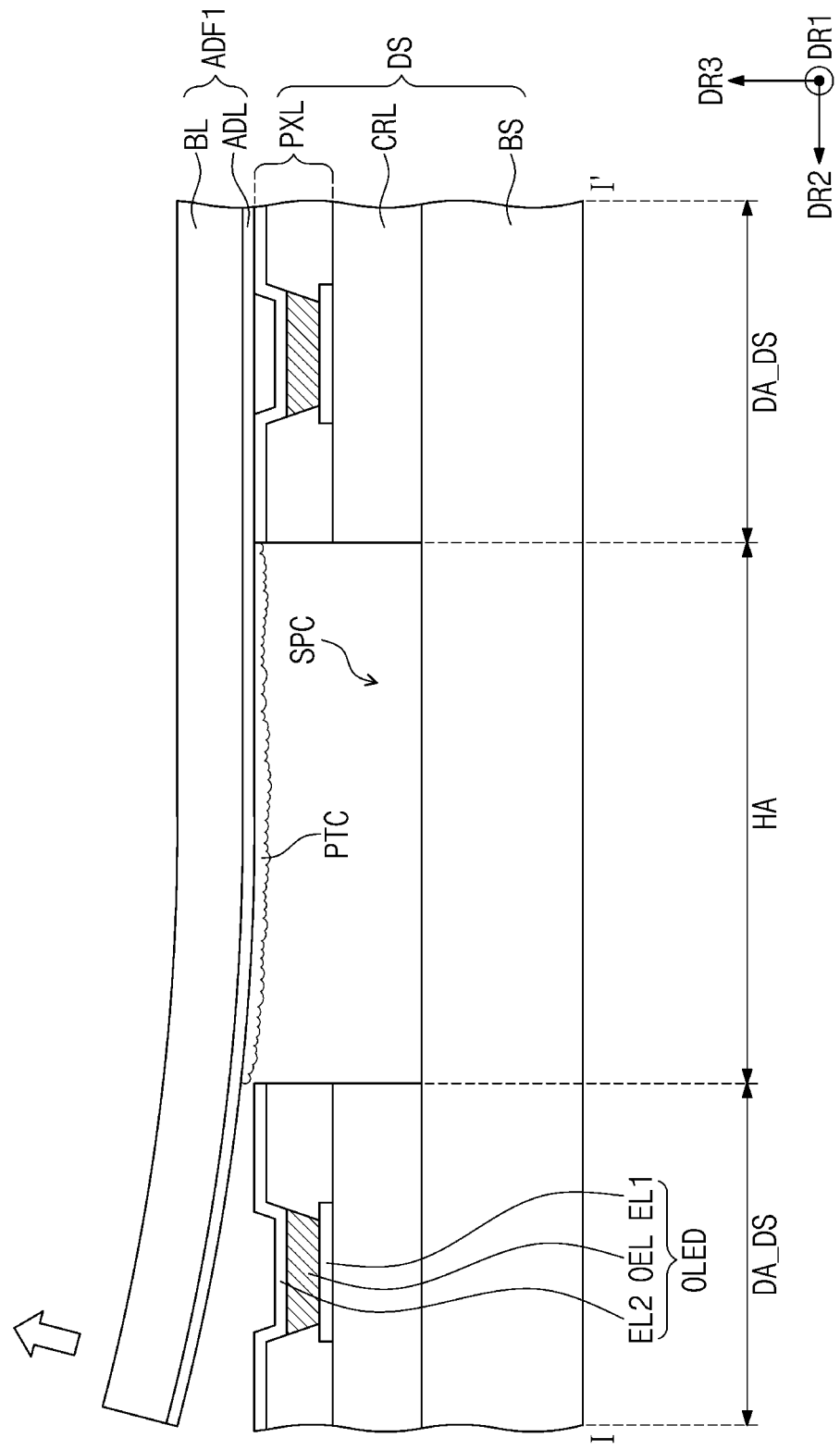

After the etching process ends, the first adhesive film ADF1 to which the dust PTC is attached is peeled off from the display substrate DS in step S4 (see FIG. 5), as illustrated in FIG. 11. Accordingly, the first adhesive film ADF1 may be a release film.

In general, dust PTC may be generated in a region of the top surface of the display substrate DS corresponding to a periphery of the hole region HA being etched or inside the groove SPC, in an etching process of the display substrate DS. A fault may occur by the dust PTC in a subsequent process for manufacturing the display panel DP (see FIG. 2). According to some embodiments of the present disclosure, however, the dust PTC generated in the etching process may effectively be removed, because the first adhesive film ADF1 not etched by the first light L1 collects the dust PTC generated in the display substrate DS in the etching process, and the first adhesive film ADF1 is peeled off after the etching process ends. Thus, according to some embodiments of the present disclosure, the yield of the display panel DP (see FIG. 2) may be improved.

Figure 12:
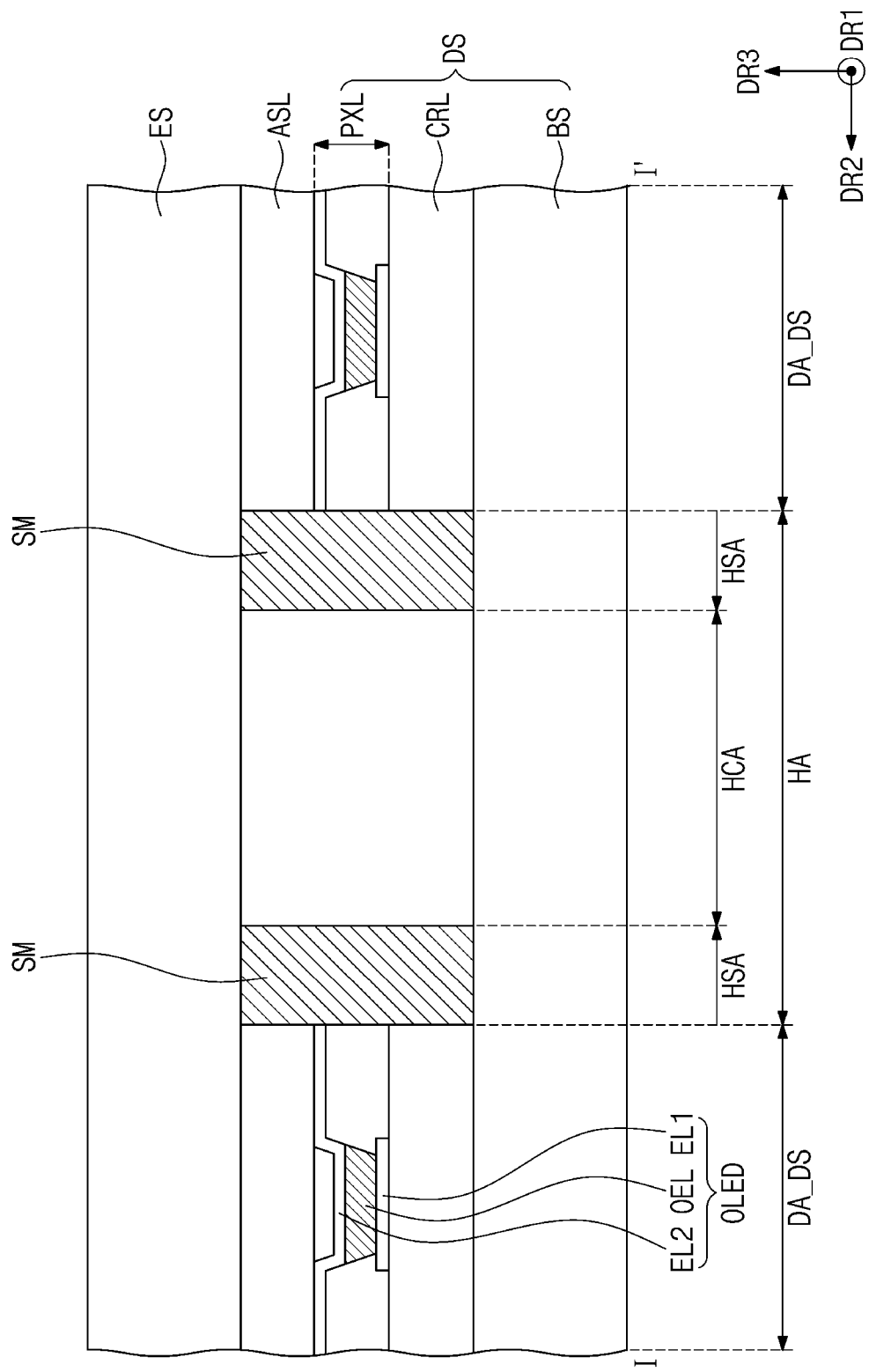

Thereafter, the encapsulation substrate ES is bonded to the display substrate DS in step S5 (see FIG. 5), as illustrated in FIG. 12. According to some embodiments, bonding of the encapsulation substrate ES and the display substrate DS in step S5 may include disposing a sealing member SM between the encapsulation substrate ES and the display substrate DS, disposing the encapsulation substrate ES on the display substrate DS, and hardening the sealing member SM by using heat or light.

The sealing member SM may be disposed in edge regions of non-display regions NDA_ES and NDA_DS (see FIG. 6) respectively defined in the encapsulation substrate ES and the display substrate DS, and in an edge region of the hole region HA. The sealing member SM may bond the display substrate DS and the encapsulation substrate ES. By way of example, the sealing member SM may be frit including glass powder.

The hole region HA defined in each of the encapsulation substrate ES and the display substrate DS may include a central region HCA and a peripheral region HSA. The central region HCA may be defined at the center of the hole region HA. The central region HCA may be a region in which the module hole MH (see FIG. 2) is substantially formed. The peripheral region HSA may be defined to surround the central region HCA. The sealing member SM described above may overlap the peripheral region HSA of the hole region HA.

The display panel DP described above may be in the form of the encapsulation substrate ES and the display substrate DS bonded together. The display panel DP may further include a filling layer ASL defined by spacing between the encapsulation substrate ES and the display substrate DS (which may be spaced apart). The filling layer ASL may include an inert gas. The filling layer ASL may prevent diffusion of foreign matter present between the display substrate DS and the encapsulation substrate ES.

Figure 13:
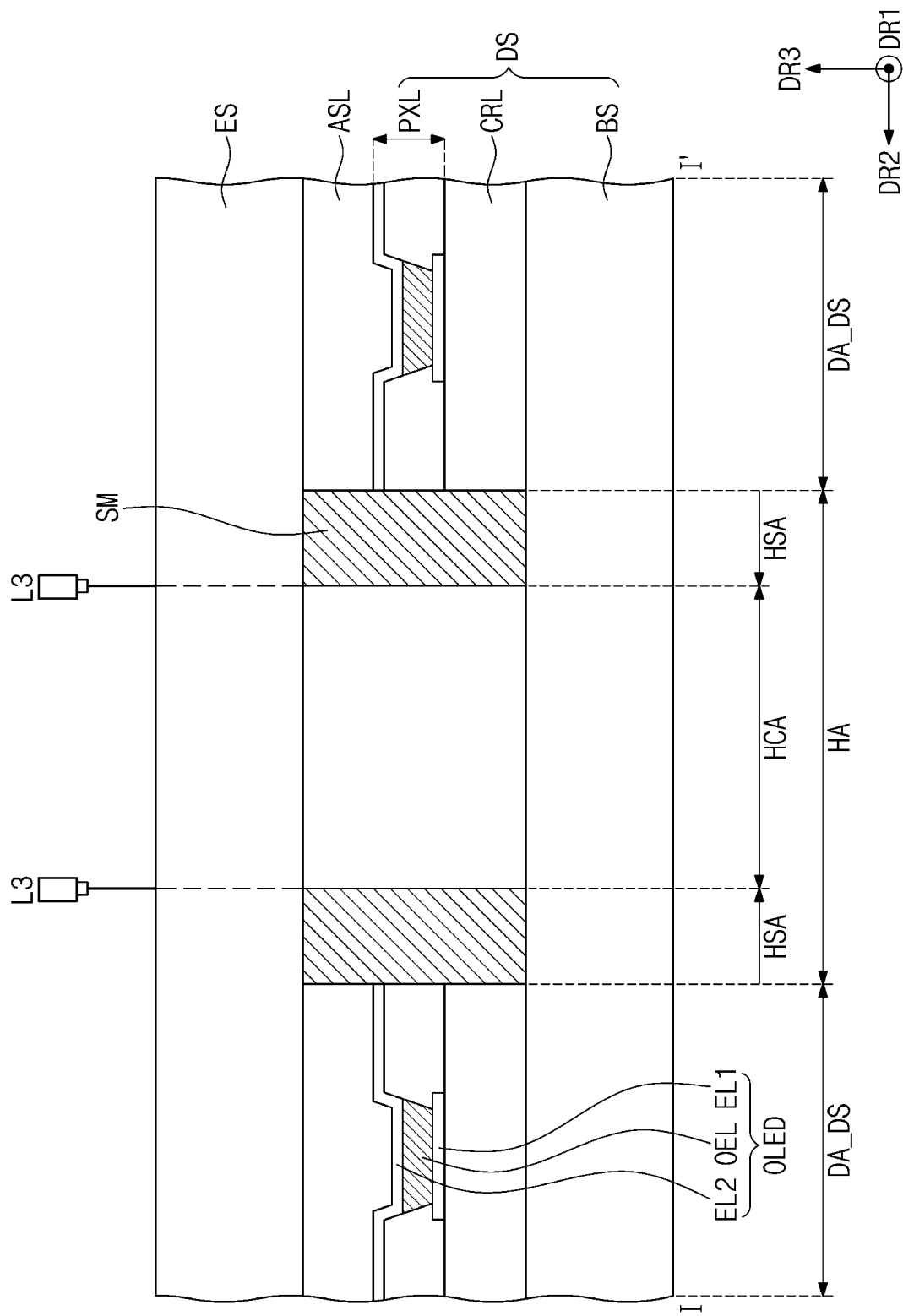

Thereafter, as illustrated in FIG. 13, third light L3 is irradiated to etch the display substrate DS and the encapsulation substrate ES in step S6 (see FIG. 5). The third light L3 may be irradiated onto the central region HCA of the hole region HA. Accordingly, the central region HCA may be etched by the third light L3. The third light L3 may be provided to the display substrate DS, the encapsulation substrate ES, and the filling layer ASL in the form of laser. By way of example, the third light L3 may be a laser having substantially the same wavelength as the first light L1.

Figure 14:
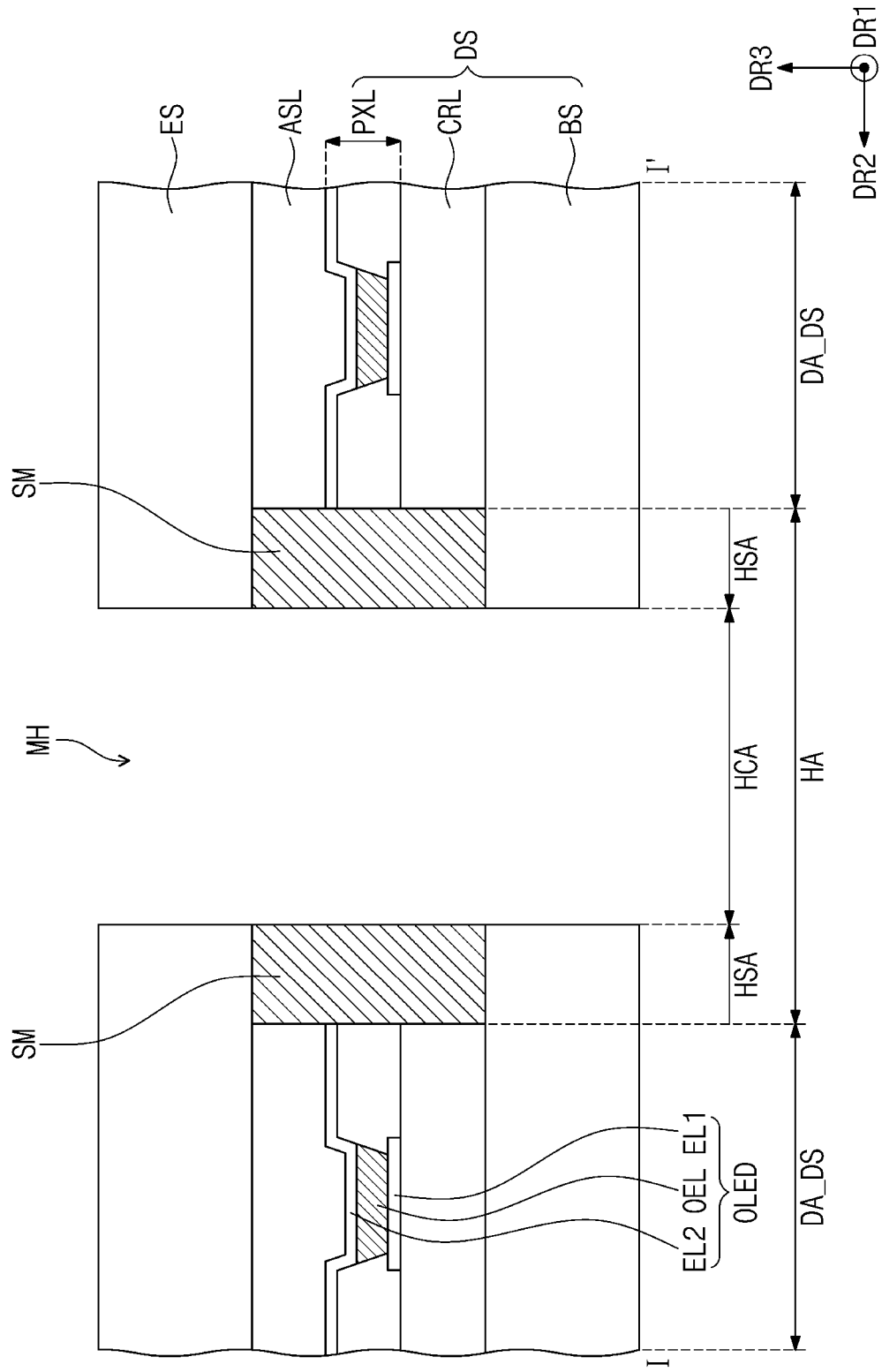

As illustrated in FIG. 14, the module hole MH may be formed in a region etched by the third light L3. The module hole MH may penetrate the display substrate DS and the encapsulation substrate ES. The module hole MH may overlap the electronic module EM (see FIG. 2) described above.

Although a method of forming the module hole MH using laser is illustrated in FIGS. 13 and 14, embodiments of the present disclosure are not particularly limited as to the method of forming the module hole MH, and the module hole MH may be formed by various methods.

Figure 15:
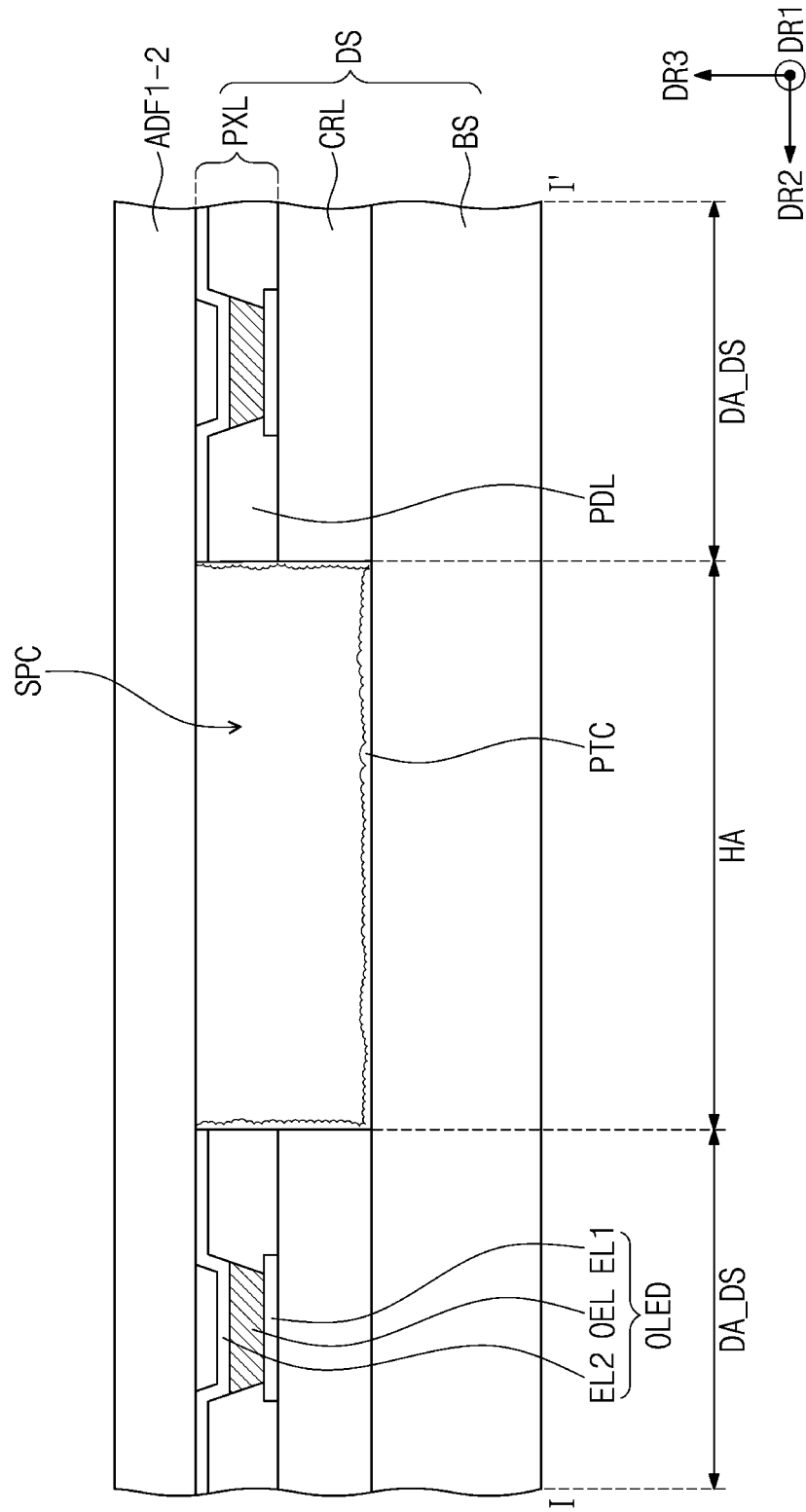
FIG. 15 illustrates disposing an adhesive film according to some embodiments of the present disclosure.

FIG. 15 illustrates disposing an adhesive film according to some embodiments of the present disclosure.

For convenience of description, differences between the embodiments in FIG. 15 and the previous embodiments will be mainly described. Additionally, the components described above are denoted by the same reference numerals, and a duplicate description of the components described above will not be given.

Referring to FIG. 15, a first adhesive film ADF1-2 used in a method of manufacturing a display apparatus according to some embodiments of the present disclosure may not have adhesion force. Accordingly, when the first adhesive film ADF1-2 is disposed on a display substrate DS, dust PTC may not be attached to the first adhesive film ADF1-2. However, even though the first adhesive film ADF1-2 does not have adhesion force, the dust PTC generated in an etching process do not move from the inside to the outside of a groove SPC, due to the first adhesive film ADF1-2.

In some embodiments, removing the dust PTC may be performed additionally after the first adhesive film ADF1-2 is peeled off. By way of example, the dust PTC may be removed by a suction unit, or the dust PTC may be moved out of the display substrate DS by a blowing unit.

Figure 16:
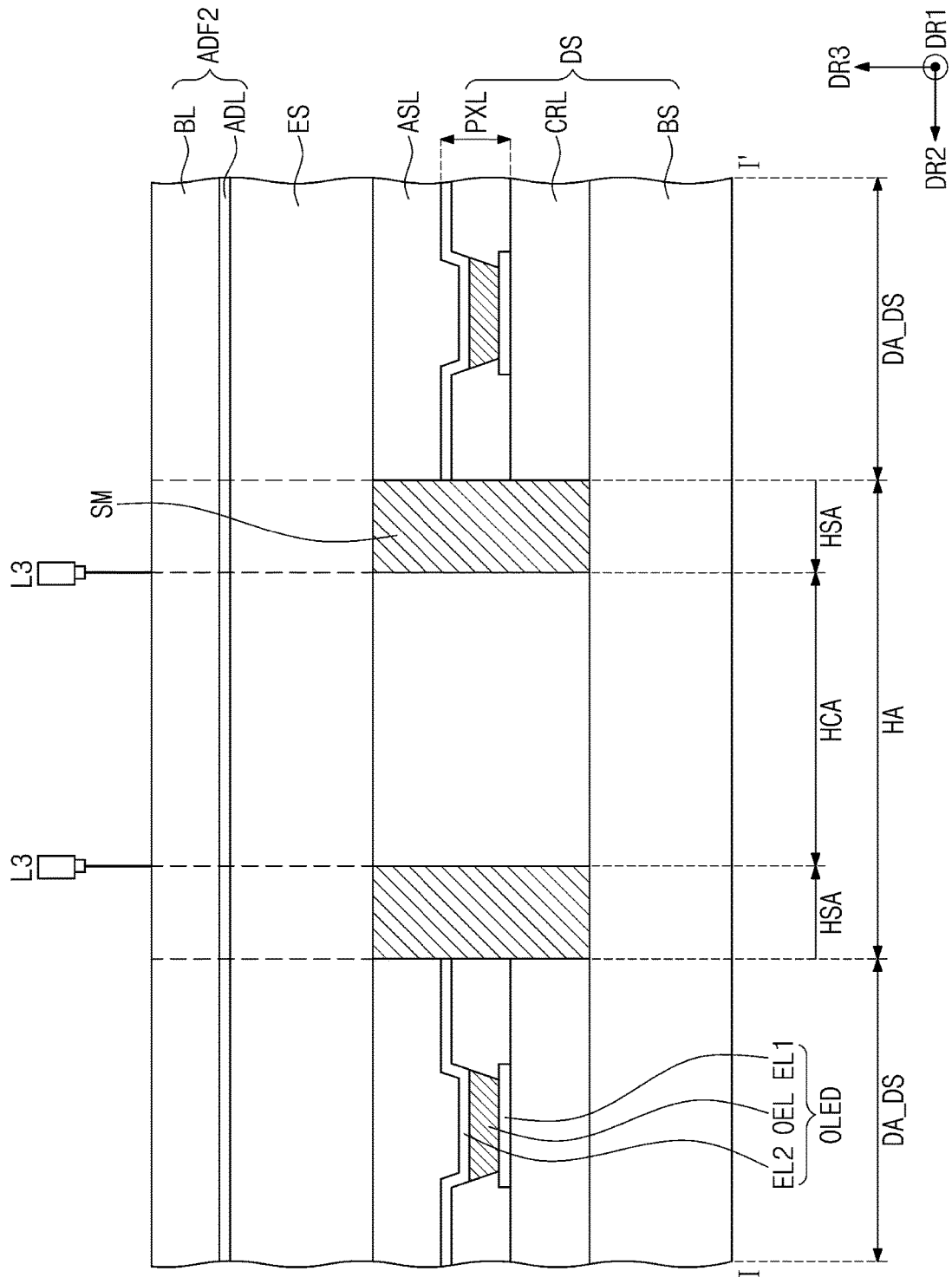
FIGS. 16 to 18 illustrate a process of forming a module hole according to some embodiments of the present disclosure.
Figure 17:
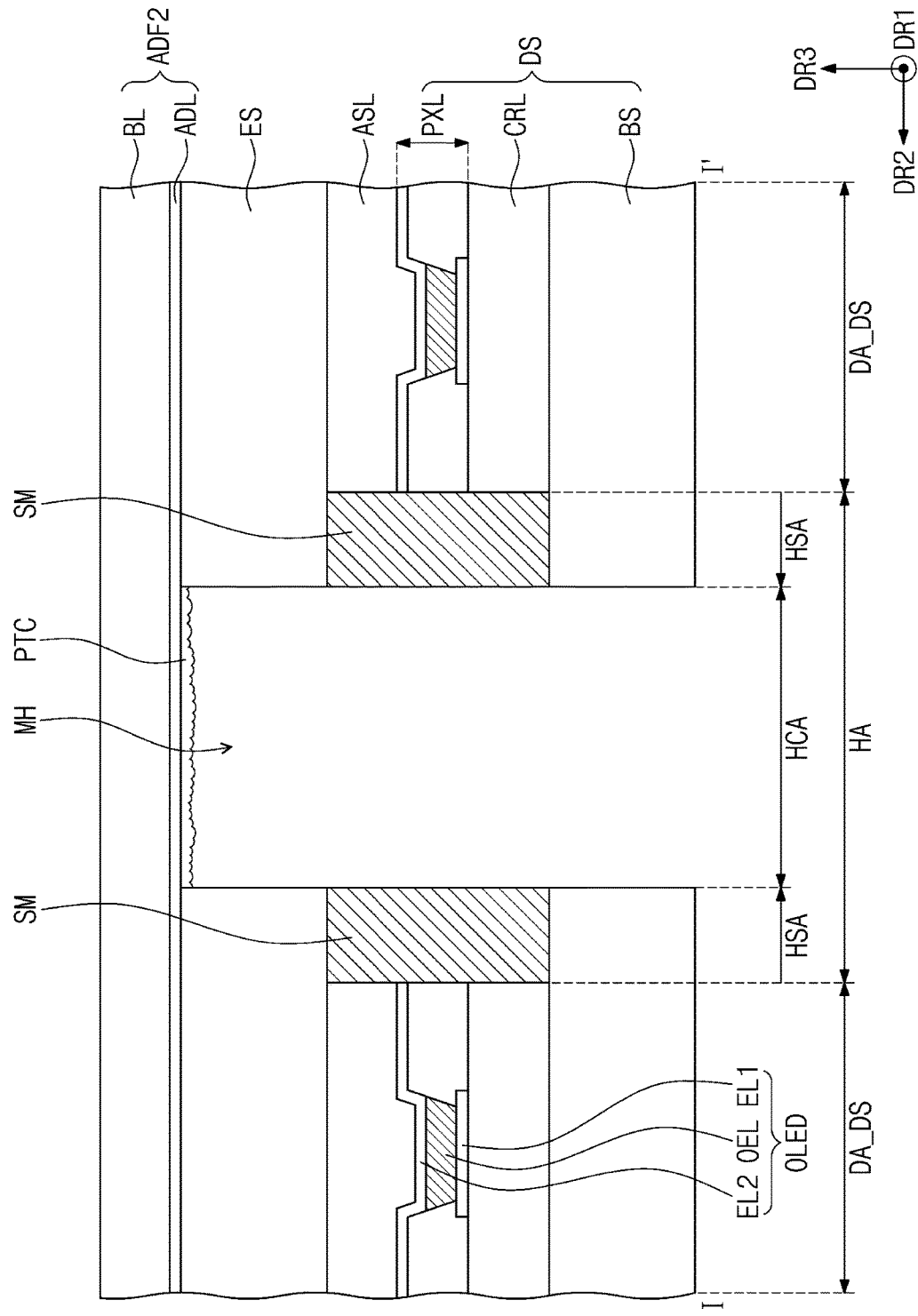
Figure 18:
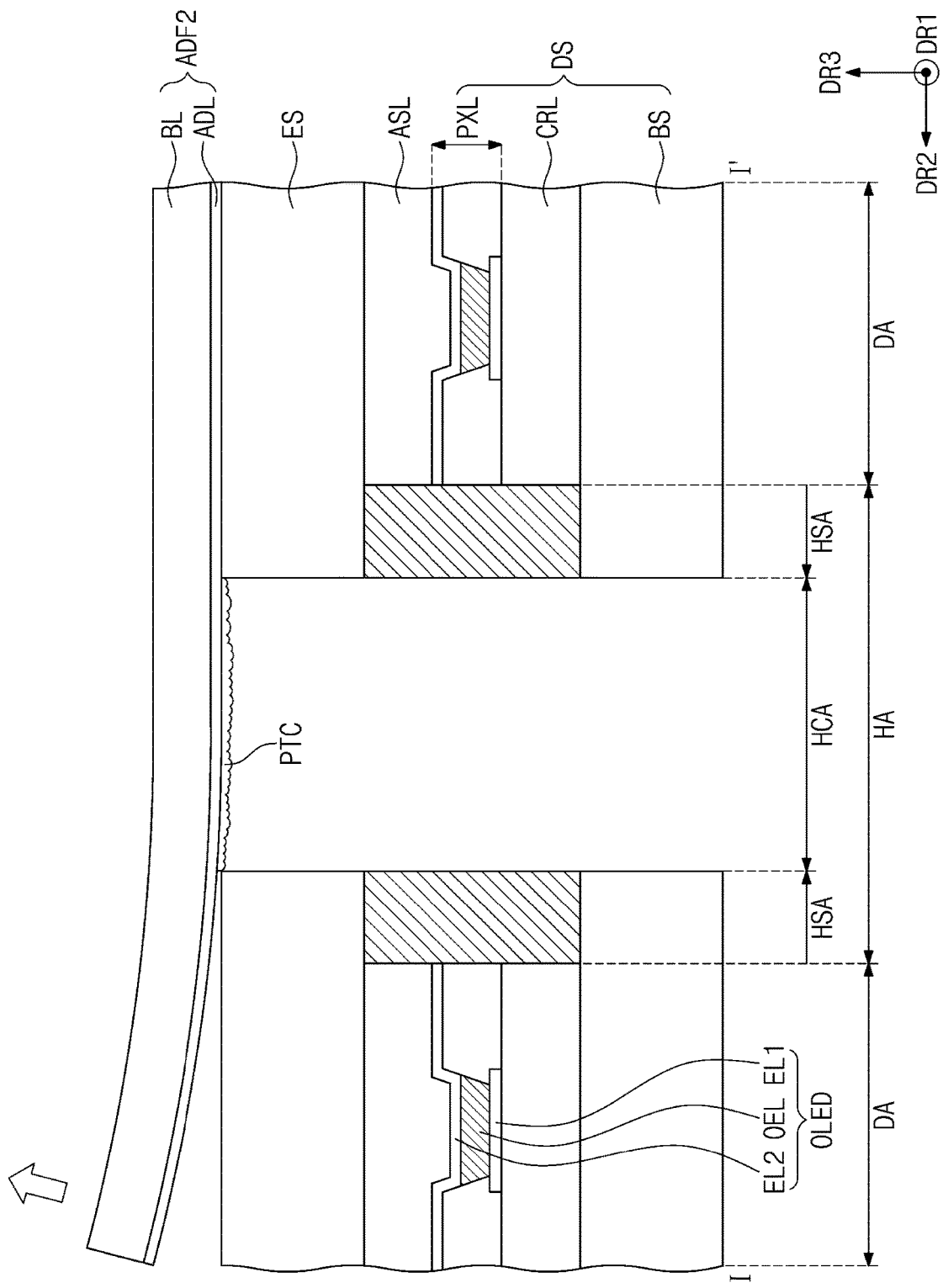

FIGS. 16 to 18 illustrate a process of forming a module hole according to some embodiments of the present disclosure.

For convenience of description, difference between the embodiments of FIGS. 16 to 18 and the previous embodiments will be mainly described. Additionally, the components described above are denoted by the same reference numerals, and a duplicate description of the components described above will not be given.

Referring to FIG. 16, a method of manufacturing a display apparatus according to some embodiments of the present disclosure may further include disposing a second adhesive film ADF2 on an encapsulation substrate ES before forming a module hole MH. The second adhesive film ADF2 contacts a top surface of the encapsulation substrate ES.

The configuration of the second adhesive film ADF2 may be the same as that of the first adhesive film ADF1 (see FIG. 8) described above. However, in some embodiments of the present disclosure, the material or transmission wavelength of the second adhesive film ADF2 may be different from the material or transmission wavelength of the first adhesive film ADF1.

After the second adhesive film ADF2 is disposed on the encapsulation substrate ES, third light L3 is irradiated onto the second adhesive film ADF2 and a display panel DS, ES, and ASL. The third light L3 may pass through the second adhesive film ADF2. Accordingly, the second adhesive film ADF2 is not etched by the third light L3. In some embodiments, the transmittance of the second adhesive film ADF2 for the third light L3 may be about 70% or larger.

As illustrated in FIG. 17, dust PTC may be generated inside the module hole MH in a process of forming the module hole MH by the third light L3 (see FIG. 16). The dust PTC may be attached to a bottom surface of the second adhesive film ADF2.

After the etching process ends, the second adhesive film ADF2 (to which the dust PTC is attached) is peeled off from the encapsulation substrate ES as illustrated in FIG. 18. Accordingly, the second adhesive film ADF2 may be a release film.

According to some embodiments of the present disclosure, the yield of the display apparatus may be improved.

Although example embodiments of the present disclosure have been described, it is understood that the present disclosure is not limited to these example embodiments, but various changes and modifications can be made by one of ordinary skill in the art within the spirit and scope of the present disclosure as hereinafter claimed.

Therefore, the disclosed subject matter is not be limited to any single embodiment described herein, and the above-described embodiments are to be considered illustrative and not restrictive. Accordingly, the scope of the present inventive concept shall be determined only according to the attached claims, and equivalents thereof.

What is claimed is:

1. A method of manufacturing a display apparatus, the method comprising:
   preparing a display substrate in which at least one hole region is defined when viewed in a planar view;
   placing a first adhesive film on the display substrate;
   etching the hole region of the display substrate by irradiating first light in the form of laser through the first adhesive film onto the display substrate; and
   peeling off the first adhesive film,
   wherein the first adhesive film transmits at least a portion of the first light.

2. The method of claim 1, wherein the first adhesive film comprises:
   a base layer; and
   an adhesive layer below the base layer,
   wherein the adhesive layer is placed between the display substrate and the base layer in the placement of the first adhesive film.

3. The method of claim 2, further comprising irradiating second light onto a region of the first adhesive film corresponding to the hole region, after the placement of the first adhesive film on the display substrate,
   wherein adhesion force of the adhesive layer increases as the second light is irradiated.

4. The method of claim 3, wherein the adhesive layer comprises a photoinitiator.

5. The method of claim 2, wherein the base layer comprises polyethylene terephthalate (PET).

6. The method of claim 5, wherein wavelength of the first light is about 310 nm or longer.

7. The method of claim 2, wherein the base layer comprises polyimide (PI).

8. The method of claim 7, wherein wavelength of the first light is about 475 nm or longer.

9. The method of claim 1, wherein transmittance of the first adhesive film is about 70% or larger for the first light.

10. The method of claim 1, further comprising removing dust generated in the hole region, after the peeling off of the first adhesive film.

11. The method of claim 10, wherein the dust is removed by a suction unit or a blowing unit.

12. The method of claim 1, wherein the display substrate comprises:
- a base substrate;
- a circuit layer which is on the base substrate and includes a plurality of thin film transistors; and
- a pixel layer which is on the circuit layer and includes a plurality of organic light-emitting elements.

13. The method of claim 12, wherein regions, corresponding to the hole region, of the pixel layer and the circuit layer of the display substrate are etched by the first light, while the base substrate of the display substrate remains intact during the etching of the display substrate.

14. The method of claim 12, wherein a region, corresponding to the hole region, of the pixel layer of the display substrate is etched by the first light, while the circuit layer and the base substrate of the display substrate remain intact during the etching of the display substrate.

15. The method of claim 1, further comprising:
- preparing an encapsulation substrate;
- bonding the display substrate and the encapsulation substrate after the peeling off of the first adhesive film; and
- forming a module hole in the hole region,
- wherein the module hole penetrates the display substrate and the encapsulation substrate.

16. The method of claim 15, wherein
the hole region comprises a central region and a peripheral region surrounding the central region, and
the bonding of the display substrate and the encapsulation substrate comprises placing a sealing member on a region of the encapsulation substrate overlapping the peripheral region.

17. The method of claim 15, wherein
the hole region comprises a central region and a peripheral region surrounding the central region, and
the forming of the module hole comprises etching regions of the display substrate and the encapsulation substrate corresponding to the central region by irradiating third light in the form of laser.

18. The method of claim 17, further comprising:
placing a second adhesive film on at least one of a top surface of the encapsulation substrate or a bottom surface of the display substrate before the forming of the module hole; and
peeling off the second adhesive film after the forming of the module hole,
wherein the third light passes through the second adhesive film.

19. A method of manufacturing a display apparatus, the method comprising:
preparing a display substrate in which at least one hole region is defined when viewed in a planar view;
placing a first adhesive film on the display substrate;
etching the hole region of the display substrate by irradiating first light in the form of laser; and
peeling off the first adhesive film,
wherein the first adhesive film transmits at least a portion of the first light, and
wherein, in the etching of the display substrate,
a groove is defined on a region of the display substrate corresponding to the hole region as the display substrate is etched, and
dust generated between inside of the groove and the first adhesive film is attached to a bottom surface of the first adhesive film.

20. A method of manufacturing a display apparatus, the method comprising:
preparing a display substrate and an encapsulation substrate in each of which at least one hole region is defined;
forming a groove in the hole region of the display substrate;
bonding the display substrate and the encapsulation substrate; and
forming a module hole in the display substrate and the encapsulation substrate so as to penetrate the hole region,
wherein the forming of the groove in the display substrate comprises:
placing a first adhesive film on the display substrate so as to overlap the hole region;
etching the hole region of the display substrate by irradiating first light which is provided in the form of laser and at least a portion of which passes through the first adhesive film; and
peeling off the first adhesive film.

* * * * *